United States Patent
Tamaki

(10) Patent No.: US 6,629,009 B1
(45) Date of Patent: Sep. 30, 2003

(54) MANAGEMENT SYSTEM FOR SEMICONDUCTOR FABRICATION DEVICE

(75) Inventor: Makoto Tamaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/525,300

(22) Filed: Mar. 14, 2000

(30) Foreign Application Priority Data

Mar. 15, 1999 (JP) .......................................... 11-068903

(51) Int. Cl.⁷ ................................................. G06F 19/00
(52) U.S. Cl. ........................................ 700/108; 700/121
(58) Field of Search ................................. 700/108, 109, 700/110, 111, 121

(56) References Cited

U.S. PATENT DOCUMENTS

| | | | | |
|---|---|---|---|---|
| 4,720,806 A | * | 1/1988 | Schippers et al. | 702/187 |
| 5,327,349 A | * | 7/1994 | Hoste | 700/110 |
| 5,910,011 A | * | 6/1999 | Cruse | 438/16 |
| 5,940,300 A | * | 8/1999 | Ozaki | 700/121 |
| 6,090,632 A | * | 7/2000 | Jeon et al. | 438/14 |
| 6,192,287 B1 | * | 2/2001 | Solomon et al. | 700/110 |
| 6,327,521 B1 | * | 12/2001 | Prober | 700/269 |

FOREIGN PATENT DOCUMENTS

| | | | |
|---|---|---|---|
| JP | 402002406 A | * | 1/1990 |
| JP | 6-89285 | | 3/1994 |
| JP | 7-152789 | | 6/1995 |
| KR | 1998-068165 | | 10/1998 |
| KR | 1999-001946 | | 1/1999 |

OTHER PUBLICATIONS

See Korean Office Action and translation.

* cited by examiner

Primary Examiner—Leo Picard
Assistant Examiner—Chad Rapp
(74) Attorney, Agent, or Firm—Edwards & Angell, LLP; David G. Conlin, Esq.; Richard J. Roos, Esq.

(57) ABSTRACT

A management system for semiconductor fabrication devices is provided with a sensor for always collecting management information from a fabrication device provided in a semiconductor fabrication process line, and a determiner for monitoring the management information collected by the sensor as a time-sequential measured value pattern, and for comparing the measured value pattern with a set value pattern registered beforehand in accordance with the management information. This enables to presume causes or the like of failures based on data, and hence, to immediately identify the causes of even sudden failures, thereby allowing measures to be immediately taken. Consequently, the process line can be stably operated.

27 Claims, 16 Drawing Sheets

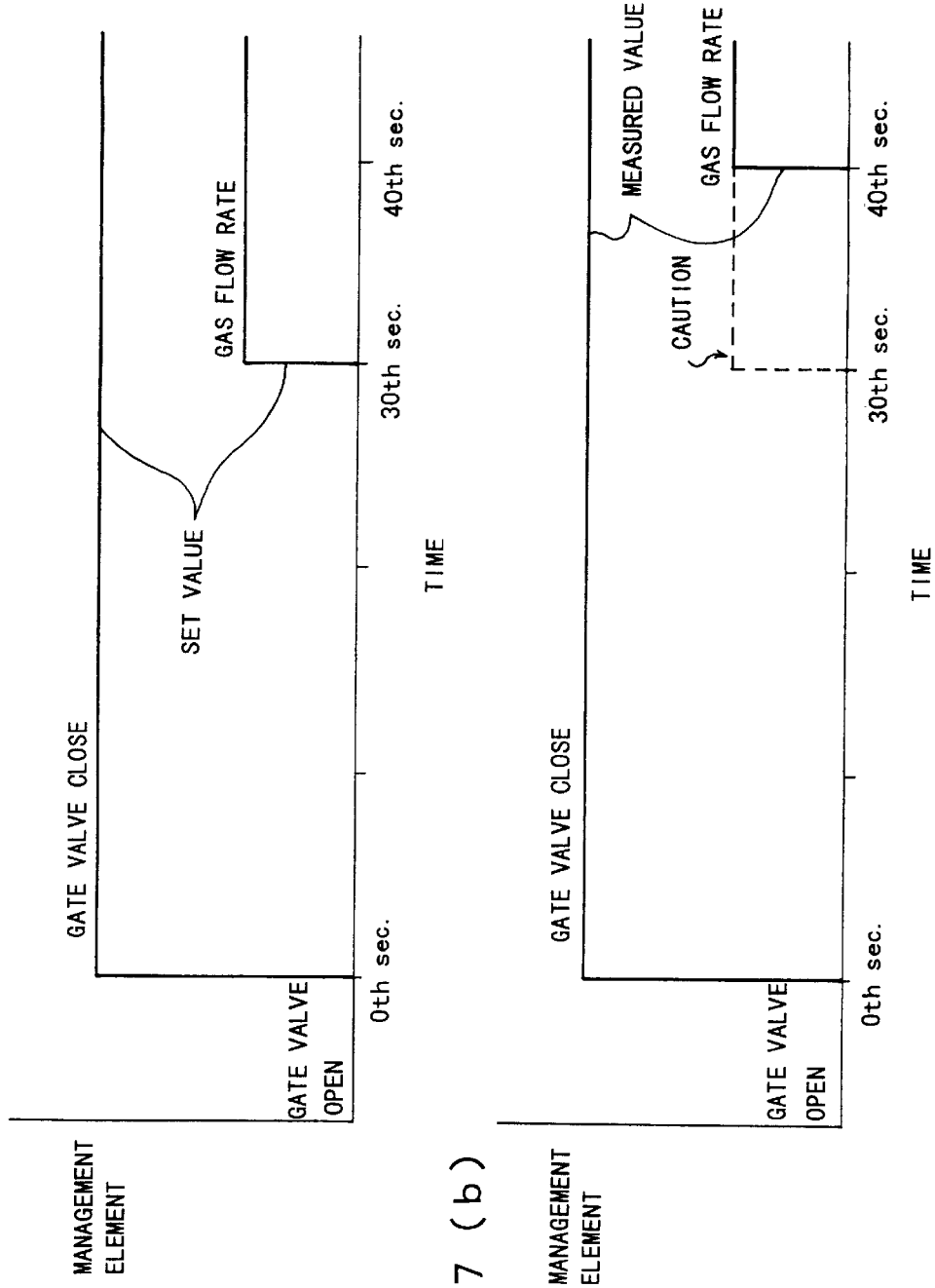
F I G. 7 (a)
F I G. 7 (b)

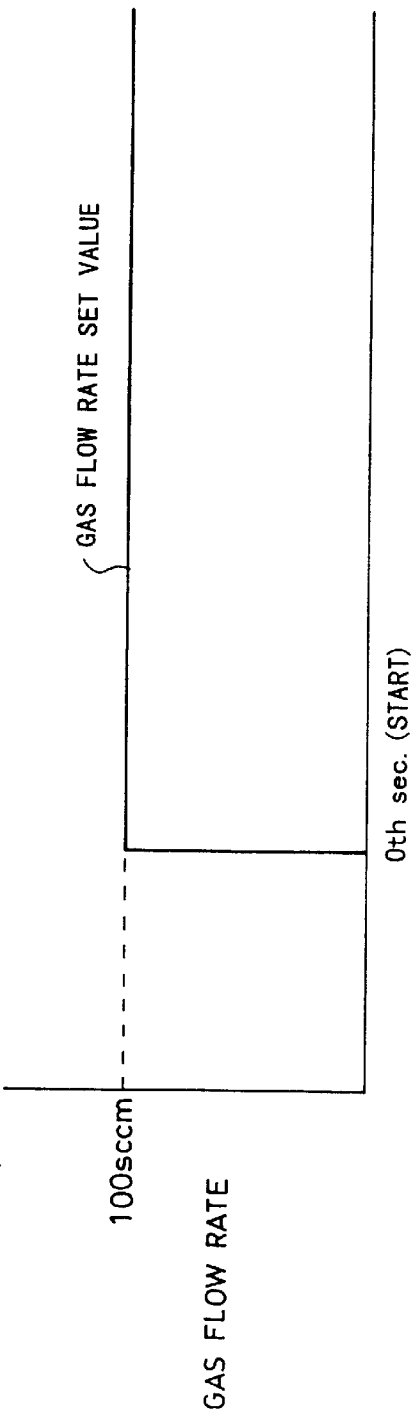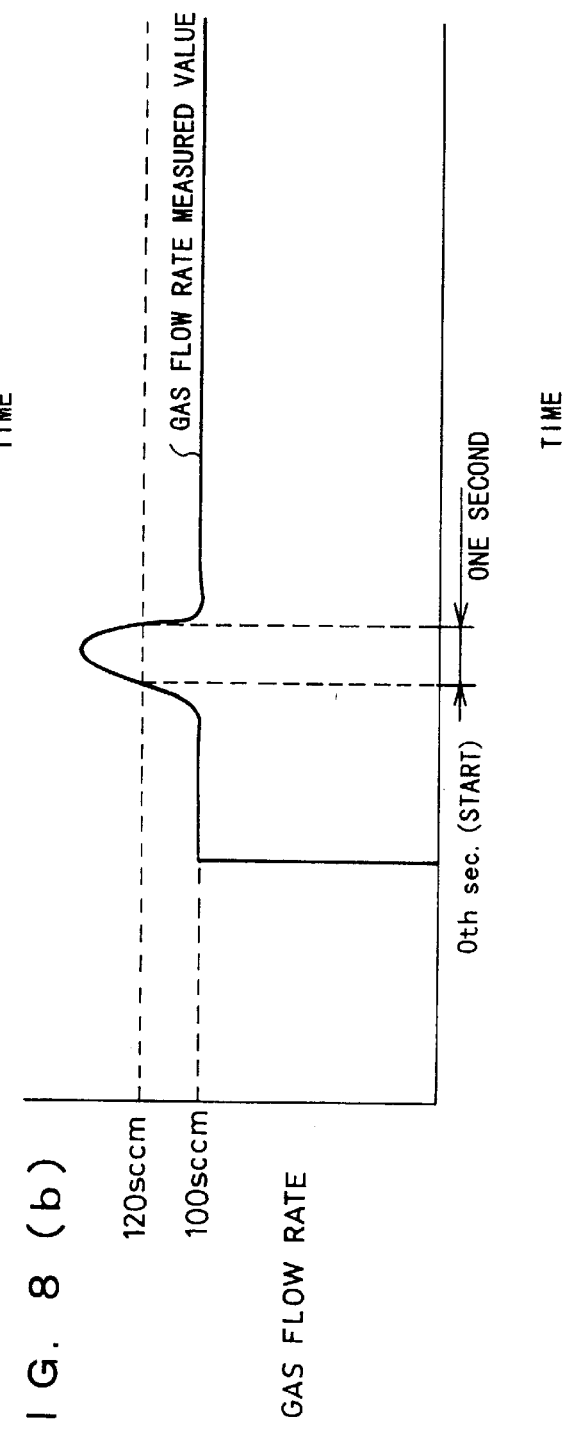

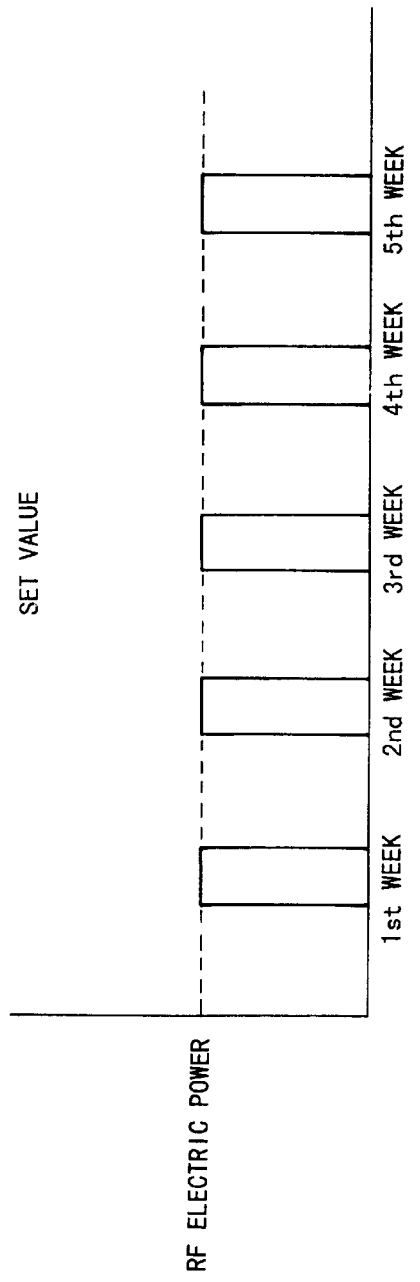
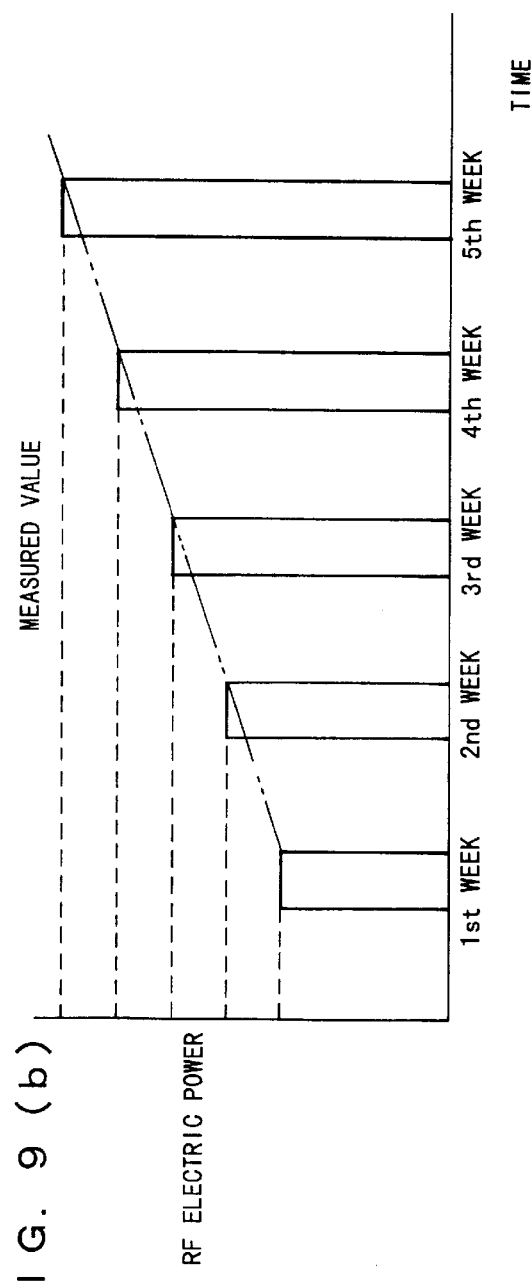
F I G. 9 (a)
F I G. 9 (b)

F I G. 1 3
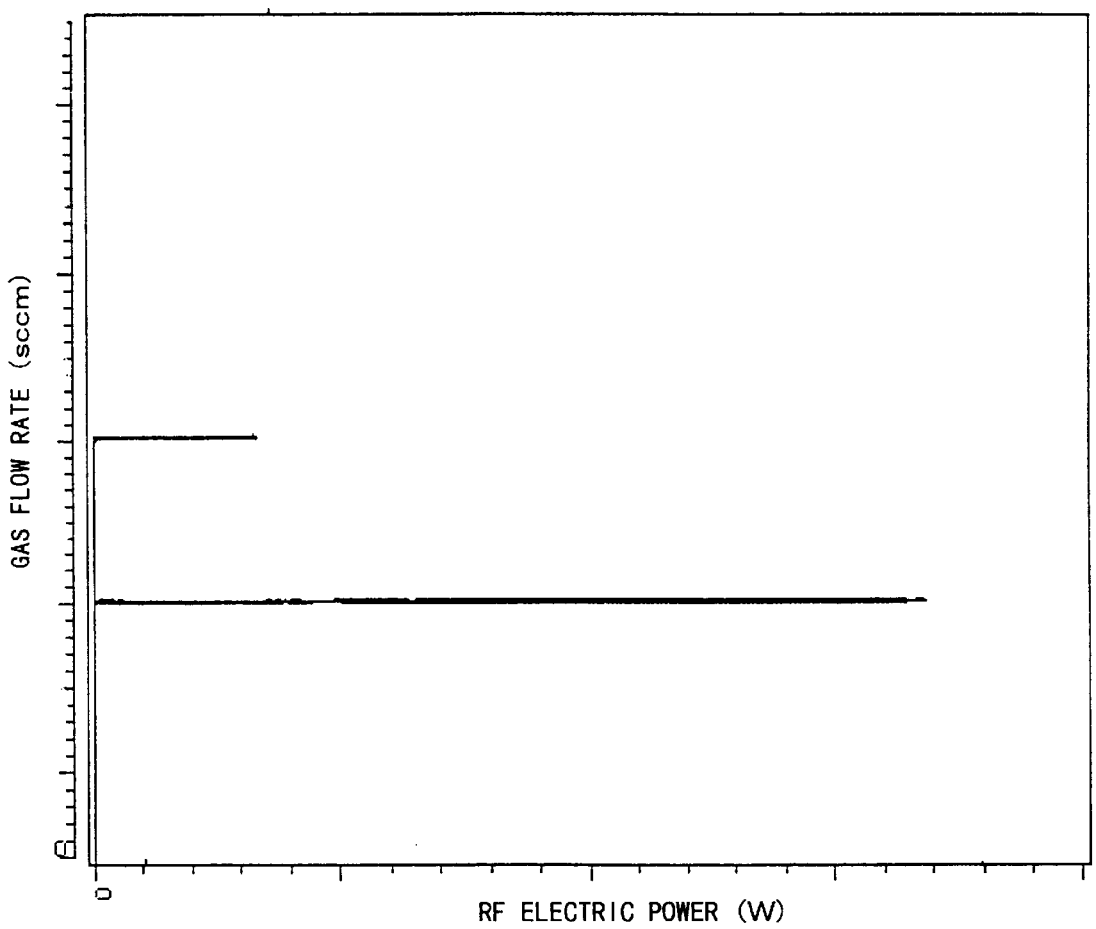

FIG. 16

| DATE TIME | | ITEM | | MEASURED RESULT |
|---|---|---|---|---|
| Jan. 2, | 3:04:05 | RF ELECTRIC POWER | UPPER LIMIT CROSSING | 1100W (SET VALUE 1000W, UPPER LIMIT 1100W) |
| | 3:04:06 | RF ELECTRIC POWER | MAXIMUM GENERATED | 1200W |
| | 3:04:07 | RF ELECTRIC POWER | RETURN TO UPPER LIMIT | 1100W (UPPER LIMIT 1100W) |
| | 3:08:09 | RF ELECTRIC POWER | LOWER LIMIT CROSSING | 900W (SET VALUE 1000W, UPPER LIMIT 900W) |
| | 3:08:10 | RF ELECTRIC POWER | MINIMUM GENERATED | 800W |
| | 3:08:11 | RF ELECTRIC POWER | RETURN TO LOWER LIMIT | 900W (UPPER LIMIT 1100W) |
| | 3:20:03 | RF ELECTRIC POWER | UPPER LIMIT CROSSING | 1100W (SET VALUE 1000W, UPPER LIMIT 1100W) |
| | 3:20:04 | RF ELECTRIC POWER | MAXIMUM GENERATED | 1170W |
| | 3:20:07 | RF ELECTRIC POWER | RETURN TO UPPER LIMIT | 1100W (UPPER LIMIT 1100W) |

MANAGEMENT SYSTEM FOR SEMICONDUCTOR FABRICATION DEVICE

FIELD OF THE INVENTION

The present invention relates to a system for managing a semiconductor fabrication device in a process line for fabricating semiconductors of liquid crystal substrates or the like.

BACKGROUND OF THE INVENTION

In a process line for fabrication of semiconductors of liquid crystal substrates or the like, process control and quality control are important with view to improving a non-defective rate. For this purpose, when a failure occurs to the process line, data necessary for diagnosing causes of the failure have to be collected.

Conventionally, in a semiconductor fabrication process line, a checking process is provided for every several processes. Upon detection of a failure, all the processes on an upstream side to the checking process are subjected to inspection, to correct the failure. More specifically, the inspection is carried out by checking recording of a process time, a processing device, a processing chamber, a device alarm, etc. as history of the process until occurrence of the failure, by checking a state of a substrate therebefore and thereafter, quality control data, and device control data, by a hearing inspection to workers, by visual check upon maintenance, etc. Then, the failure is tentatively reproduced based on the inspection result so that a cause of the failure can be diagnosed.

It is difficult, however, to diagnose a cause of a failure that has suddenly occurred. This is because a sudden failure is not reproducible, thereby being scarcely reproduced in a reproduction test even under the same conditions.

Therefore, in a conventional semiconductor fabrication process line, permanent supervision by technicians has been required to carry out plasma visual check, signal check, condition check, robot action check, sound check, event list check, visual check of a substrate after processing (check after film formation), etc. to take precautions against a sudden failure. Upon occurrence of a sudden failure, the technicians have determined based on their expertise whether to adjust the fabrication device or to stop the fabrication device to carry out disassembly and maintenance of the fabrication device, to lower a rate of occurrence of a sudden failure.

Incidentally, the following Japanese Publications for Laid-Open Patent Applications should be noted, though their disclosures belong to fields different from that of the present invention.

The Japanese Publication for Laid-Open Patent Application No. 89285/1994 (Tokukaihei 6-89285 [Issue Date: Mar. 29, 1994]) discloses a process control system applied to spindle motor production process lines, in which defect input switches corresponding to defect items are provided and the fetching and totalizing of data is conducted in real time by a computer network. The foregoing process control system, however, only classifies and totalizes defects according to the defect items, and is incapable of diagnosing the causes of defects and the processes of occurrence of defects. Furthermore, it does not determine whether a product is defective or non-defective before an inspection process, and hence, cannot be applied to real-time checking.

The Japanese Publication for Laid-Open Patent Application No. 152789/1995 (Tokukaihei 7-152789 [Issue Date: Jun. 16, 1995]) discloses a plant analysis equipment diagnosis system for a manufacture process line in a steel plant. According to the foregoing system, without depending on the observer's expertise, a state of a manufacturing apparatus is compared with time-sequential patterns assuming abnormal time, and when they are matched, a warning is outputted. The plant analysis equipment diagnosis system thus arranged predicts a danger leading to operation deterioration of a plant, and allows preventive maintenance to be carried out. However, the foregoing plant analysis equipment diagnosis system only prevents operation deterioration, and confirmation of normal operations, maintenance and management of normal quality of products, and diagnosis of a cause of an abnormal event are dependent on the observer's expertise and data obtained through test operations. Adjustment of the plant is also dependent on the observer.

On the other hand, the aforementioned conventional method for managing semiconductor fabrication device has a drawback in that the cause of a sudden failure cannot be diagnosed. In other words, conventionally, serial control signals are not grasped in the fabrication process line for fabricating semiconductors of liquid crystal substrates and the like, and this makes it impossible to diagnose causes of sudden failures. Furthermore, since collation of a measurement sequence with a setting sequence regarding a fabrication device is not carried out or such collation is insufficient, the quality of products is not uniform, as well as sudden failures tend to occur. Furthermore, as described above, a rate of occurrence of sudden failures can be lowered by adjustment or maintenance of a fabrication device based on technicians' expertise, but reasons for the lowering of the failure occurrence rate are left unknown.

Conventionally, regarding this problem, inspection has been made by using an adopted method, and adequacy of the adopted method has been inductively argued based on the result. In other words, a method has been induced from countermeasures applied in coping with similar irregular events in the past (from experiences), and if a result obtained was not satisfactory, overcoming the problem has been attempted by repeated trial and error.

SUMMARY OF THE INVENTION

An object of the present invention is to provide a management system for a semiconductor fabrication device capable of allowing a process line to stably operate as well as discovering a cause of a sudden failure.

To achieve the foregoing object, a management system for a semiconductor fabrication device in accordance with the present invention includes (i) a sensor for always collecting management information from a fabrication device provided in a semiconductor fabrication process line, and (ii) a determiner for monitoring the management information collected by the sensor as a time-sequential measured value pattern, and for comparing the measured value pattern with a set value pattern registered beforehand in accordance with the management information.

Furthermore, a semiconductor fabrication device management method in accordance with the present invention includes the steps of (a) monitoring management information collected by a sensor as a time-sequential measured value pattern, the sensor always collecting management information from a fabrication device provided in a semiconductor fabrication process line, and (b) comparing the measured value pattern with a set value pattern registered beforehand in accordance with the management information.

According to the foregoing system and method, to confirm states of the fabrication devices and the processing operation in the semiconductor fabrication process line, a variety of waveforms are collected at all times by means of sensors provided in respective fabrication devices, the sensors detecting management information such as a temperature, a moisture, a concentration, a pressure, a gas flow rate, electric power, sequence electric signals, mechanical electrical indices, etc.

Then, by the determiner, waveform data of the measured value pattern obtained are compared with waveform data of the set value patten registered beforehand in accordance with the management information. More specifically, a control start point is confirmed, and the measured value pattern is compared with the set value pattern, so that a deviation of the measured value pattern from the set value pattern is detected.

Thus, in the foregoing management system for a semiconductor fabrication device in which values measured by the sensors are always monitored in the form of time-sequential waveform data, when a sudden failure occurs, a cause, a time, relevance to another factor, a rate of occurrence, distribution of conditions of the occurrence, of the failure can be presumed data. This enables immediate discovery of the cause of the sudden failure, thereby ensuring that measures to cope with the failure can be taken immediately.

For instance, in the case where a failure occurs to the semiconductor fabrication device, it is also possible to stop the fabrication device by outputting a device stop signal to the fabrication device based on the result of comparison of the foregoing measured value pattern with the set value pattern. Here, along with graphs of sensor data, presumed causes of failure can be shown to workers in a descending order of probability thereof. It is also possible to show an inspection method and a determination method to the workers. In other words, not only the fabrication device in the fabrication process line can be stopped/replaced, but also a cause of the failure can be discovered by carrying out tests on factors presumed as causes of the failure in a descending order of probability. This results in efficient selection of measurement to cope with the sudden failure.

Therefore, according to the foregoing management system and method for a semiconductor fabrication device, an analysis scheme for low-cost production is efficiently suggested by using the sensor data of the fabrication device. Consequently, by applying adjustment and modification to the fabrication device to remove the cause of the failure, the fabrication process line can be stably operated, resulting in that a high yield is achieved.

For a fuller understanding of the nature and advantages of the invention, reference should be made to the ensuing detailed description taken in conjunction with the accompanying drawings.

BRIEF DESCRIPTION OF THE DRAWINGS

FIG. 7($a$) is an explanatory view illustrating a theoretical sequence waveform of sequence management conducted by the management system for semiconductor fabrication devices shown in FIG. 4.

FIG. 7($b$) is an explanatory view illustrating a measured value waveform of sequence management conducted by the management system for semiconductor fabrication devices shown in FIG. 4.

FIG. 8($a$) is an explanatory view illustrating a theoretical sequence waveform of sequence management conducted by the management system for semiconductor fabrication devices shown in FIG. 4.

FIG. 8($b$) is an explanatory view illustrating a measured value waveform of sequence management conducted by the management system for semiconductor fabrication devices shown in FIG. 4.

FIG. 9($a$) is an explanatory view showing set values for management conducted by the management system for semiconductor fabrication devices shown in FIG. 4, the set values being based on data about changes with time.

FIG. 9($b$) is an explanatory view showing measured values for management conducted by the management system for semiconductor fabrication devices shown in FIG. 4, the measured values being based on data about changes with time.

FIG. 13 is a view for explaining the example in which the management system for semiconductor fabrication devices shown in FIG. 4 is applied to the liquid crystal substrate fabrication process line. The view is a graph showing relationship between RF electric power and a gas flow rate after changing the sequence of formation of an insulator film and a semiconductor film in a vacuum film forming device.

FIG. 16 is an explanatory view illustrating management using upper and lower set limits, carried out by a management system for semiconductor fabrication devices in accordance with a conventional technique.

DESCRIPTION OF THE PREFERRED EMBODIMENTS

First Embodiment

The following description will explain an embodiment of the present invention while referring to FIGS. 1 through 9.

A management system for semiconductor fabrication devices in accordance with the present embodiment is a monitor system for consecutively catch a plurality of sensor data with use of a single or plural monitor devices. Hereinafter a liquid crystal substrate fabrication device management system that is an inline system enabling continuous processing by connecting a plurality of processing equipments is taken as an example to explain the present embodiment, but a system of another scheme is applicable to the present invention.

A management method taken by the management system for semiconductor fabrication devices in accordance with the present embodiment is particularly a fabrication method in which with use of sensor data about the fabrication device or the like, an analysis technique for low-cost production is efficiently suggested by means of the inline monitor technique, and a process state monitoring method for quality control, process line control, maintenance management, device control, etc. The following describes an outline of the management method taken by the foregoing management system for semiconductor fabrication devices.

① Sensors are provided in the fabrication device, so that data are obtained at all times. Theoretically products of same quality are to be produced in the case where fabrication conditions are same. Therefore, assuming that variation of fabrication conditions that are causes of failures are caused by variation of control of the fabrication device, the fabrication device and fabrication conditions are monitored at all times.

② Time-sequential data are compared. Whether the fabrication conditions are stable or variable is inspected. Moreover, whether the variation is random or regularly dispersed and what is a characteristic of the variation are inspected. Then, occurrence of an abnormal event is predicted based on results of the inspections.

③ Upon occurrence of a sudden failure, a factor that has changed is detected by inspecting situations at the occurrence of the failure.

④ In the case where the quality of products varies in spite of stability of the control conditions of the fabrication device, sensors are added to monitor more items.

⑤ In the case where a failure occurs not due to changes in control conditions but due to changes in environmental conditions inside the fabrication device (for example, a film forming chamber), the technique is switched to a technique in which a state inside a reaction chamber is monitored.

1. Arrangement of System

Figure 4:
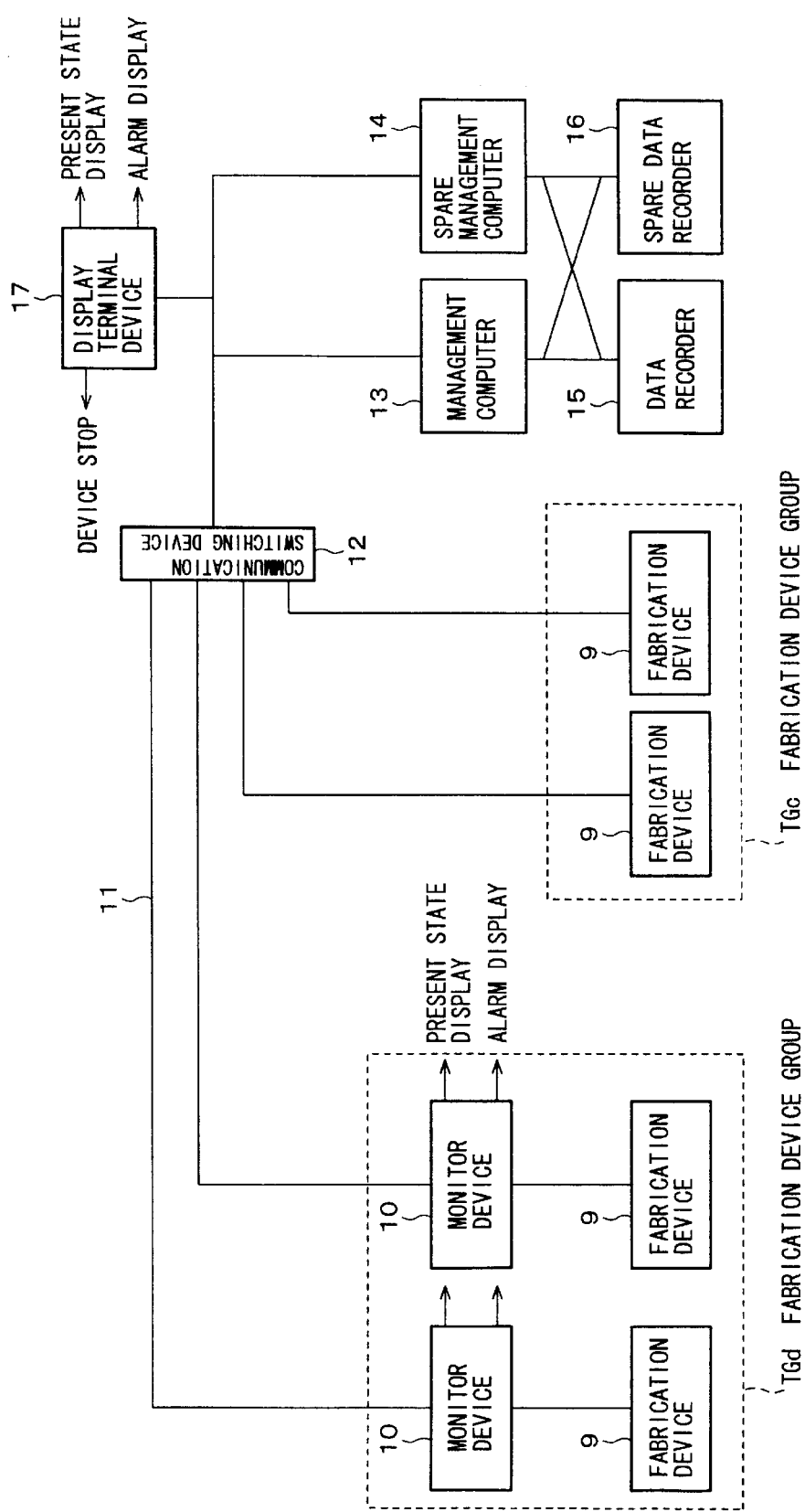
FIG. 4 is a block diagram schematically illustrating an arrangement of a management system for semiconductor fabrication devices in accordance with an embodiment of the present invention.

As shown in FIG. 4, the management system for semiconductor fabrication devices in accordance with the present embodiment is arranged in a network form so as to manage fabrication process data.

The foregoing management system for semiconductor fabrication devices includes fabrication devices 9, monitor devices 10, a communication switching device 12, a management computer (fabrication process line control means) 13, a data recorder 15, a spare management computer 14, a spare data recorder 16, and a display terminal device 17 that are connected by a network cable 11 in a network form.

Incidentally, the spare management computer 14 and the spare data recorder 16 are spare devices of the management computer 13 and the data recorder 15, respectively, and are preferably provided to ensure stable operations of the management system.

Examples of the foregoing fabrication devices 9 provided along a liquid crystal substrate fabrication process line include a washing device, a sputtering device, a CVD (chemical vapor deposition) device, an exposing device, a wet etching device, a dry etching device, an electrolytic plating device, an anodizing device, an ion injection device, an annealing device, and a vacuum vapor deposition device.

Here, the fabrication devices 9 in a fabrication device group TGc are terminal devices in a centralized management formula, and each of these fabrication devices 9 is directly networked with the management computer 13. On the other hand, the fabrication devices 9 in a fabrication device group TGd are terminal devices in a dispersed management formula, and each of these fabrication devices 9 is connected with the monitor device 10, then connected with the management computer 13 via the monitor device 10.

Thus, the foregoing management system for semiconductor fabrication devices manages fabrication process data about the fabrication devices 9 under its management by means of the foregoing management computer 13, either in the centralized management formula or in the dispersed management formula.

First, the centralized management formula is as follows. The fabrication devices 9 in the fabrication device group TGc are arranged so that all data of the fabrication devices 9 without monitoring management capability are transferred to the management computer 13, where determination about whether a product is defective or non-defective (hereinafter referred to as defectiveness determination) is managed. The management computer 13 stores the data and the defectiveness determination and its result, and carries out display of a present state (hereinafter referred to as present state display), alarm display, and device stop instruction.

More specifically, in the centralized management formula, the data of each fabrication device 9 are transferred to a centralized management system managing the fabrication process of the whole plant or a centralized management system managing one of a plurality of processes in the plant. The centralized management system (the management computer 13) analyzes consistency of the data and carries out the defectiveness determination. Thus, in the centralized management formula, the defectiveness determination at each fabrication device 9 can be managed in real time by the plant management system managing the fabrication devices 9.

On the other hand, the foregoing fabrication devices 9 in the fabrication device group TGd are arranged so that each fabrication device 9 is connected with a monitor device 10 so as to have monitoring management capability. With this, each monitor device 10 carries out the defectiveness determination at each fabrication device 9, carries out a present state display and alarm display, and transfers results of the defectiveness determination or all the data to the management computer 13. Here, in the case where only the defectiveness determination is transferred to the management computer 13, a load on the management system stemming from communication can be reduced since a quantity of transferred data are extremely small.

More specifically, in the dispersed management formula, the management of the defective and non-defective products is dispersely executed, and results of defectiveness determination are transferred to a plant management system. Incidentally, the results may be transferred to a system for managing/monitoring data about the fabrication process, instead of the plant management system.

The foregoing management system for semiconductor fabrication devices is thus capable of identifying a substrate affected by a failure, by always carrying out the centralized management or dispersed management of data about the system.

Figure 1:
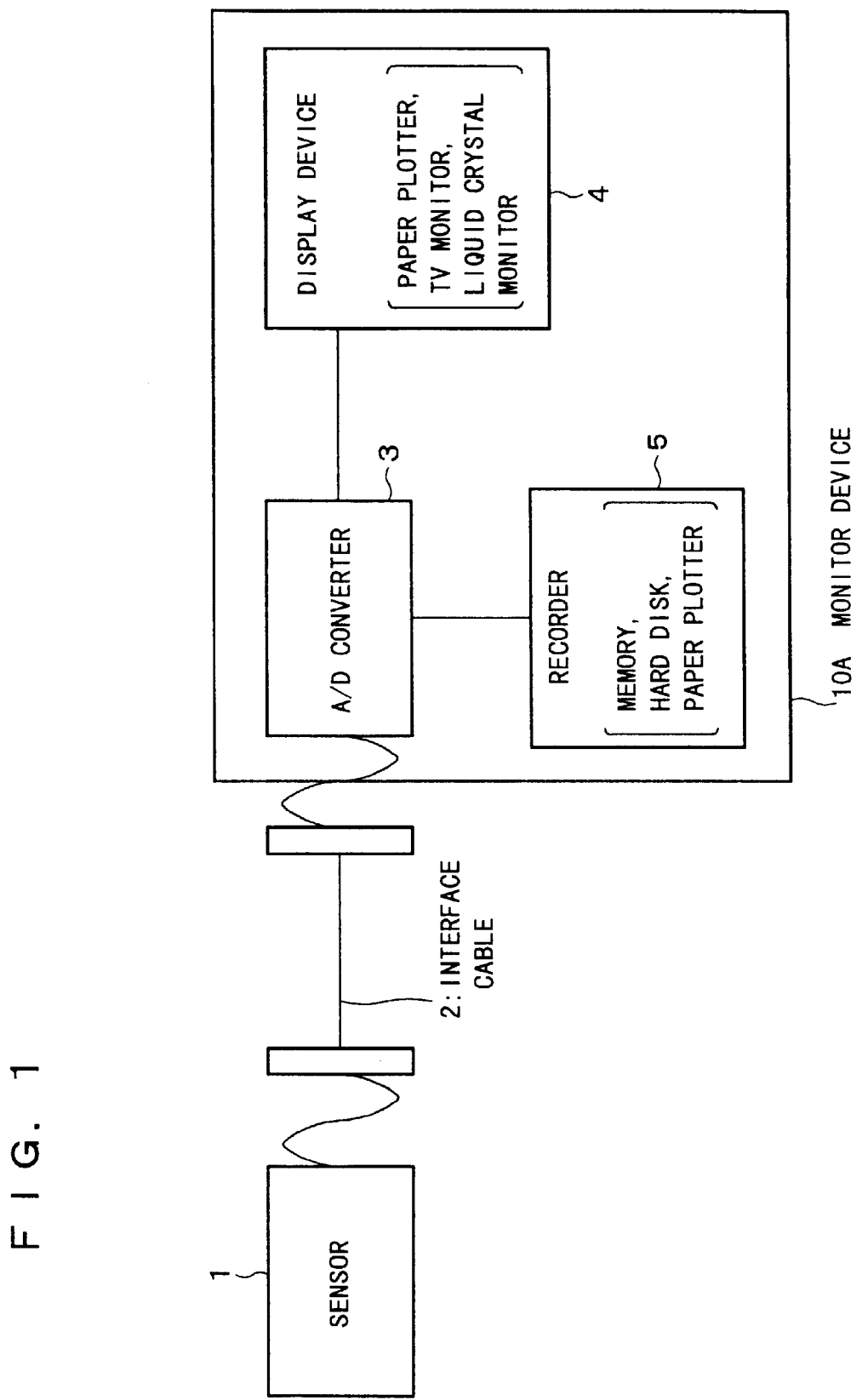
FIG. 1 is a block diagram schematically illustrating an arrangement of a monitor device provided in a management system for semiconductor fabrication devices shown in FIG. 4.
Figure 2:
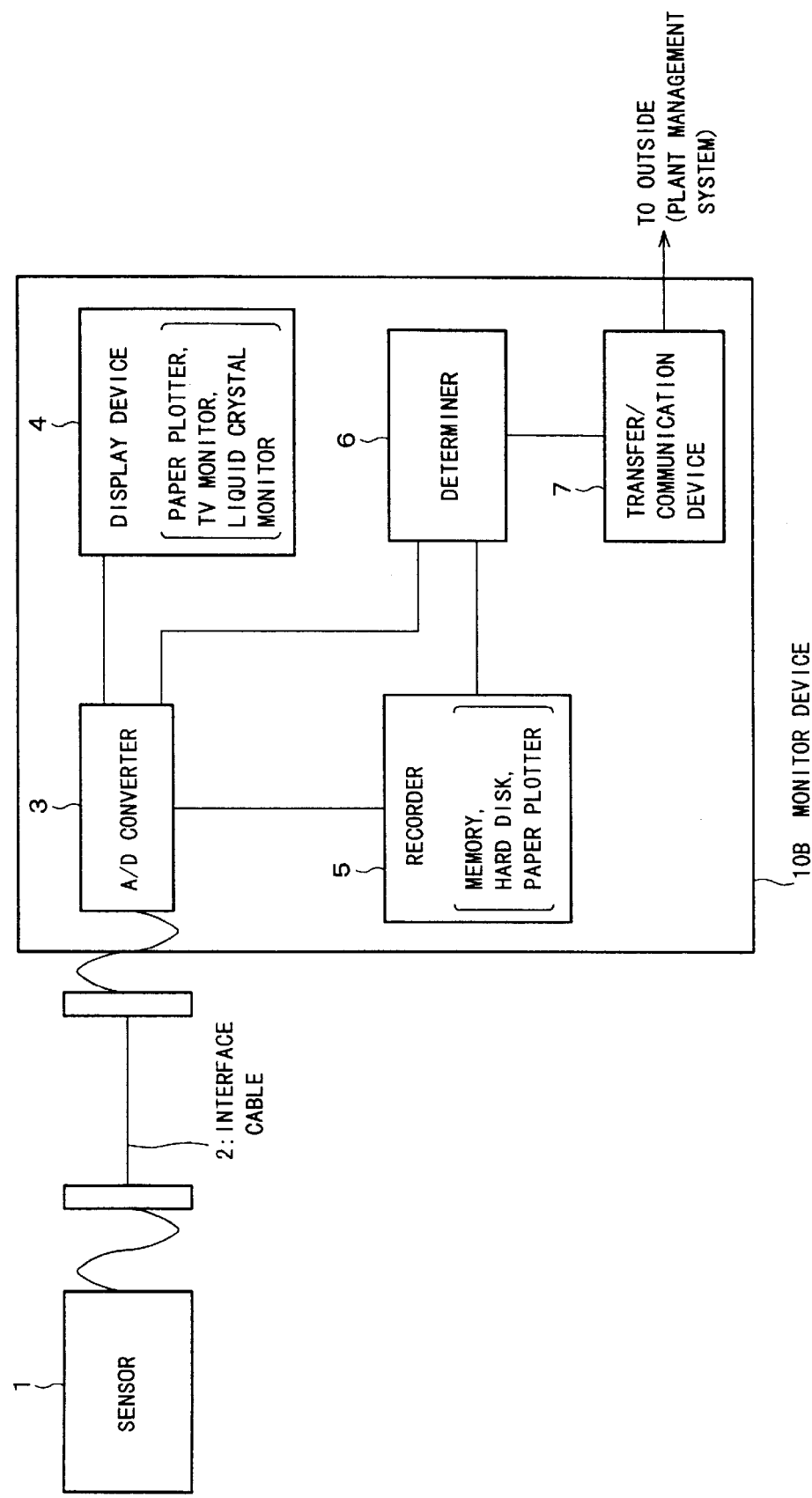
FIG. 2 is a block diagram schematically illustrating an arrangement of another monitor device provided in the management system for the semiconductor fabrication devices shown in FIG. 4.
Figure 3:
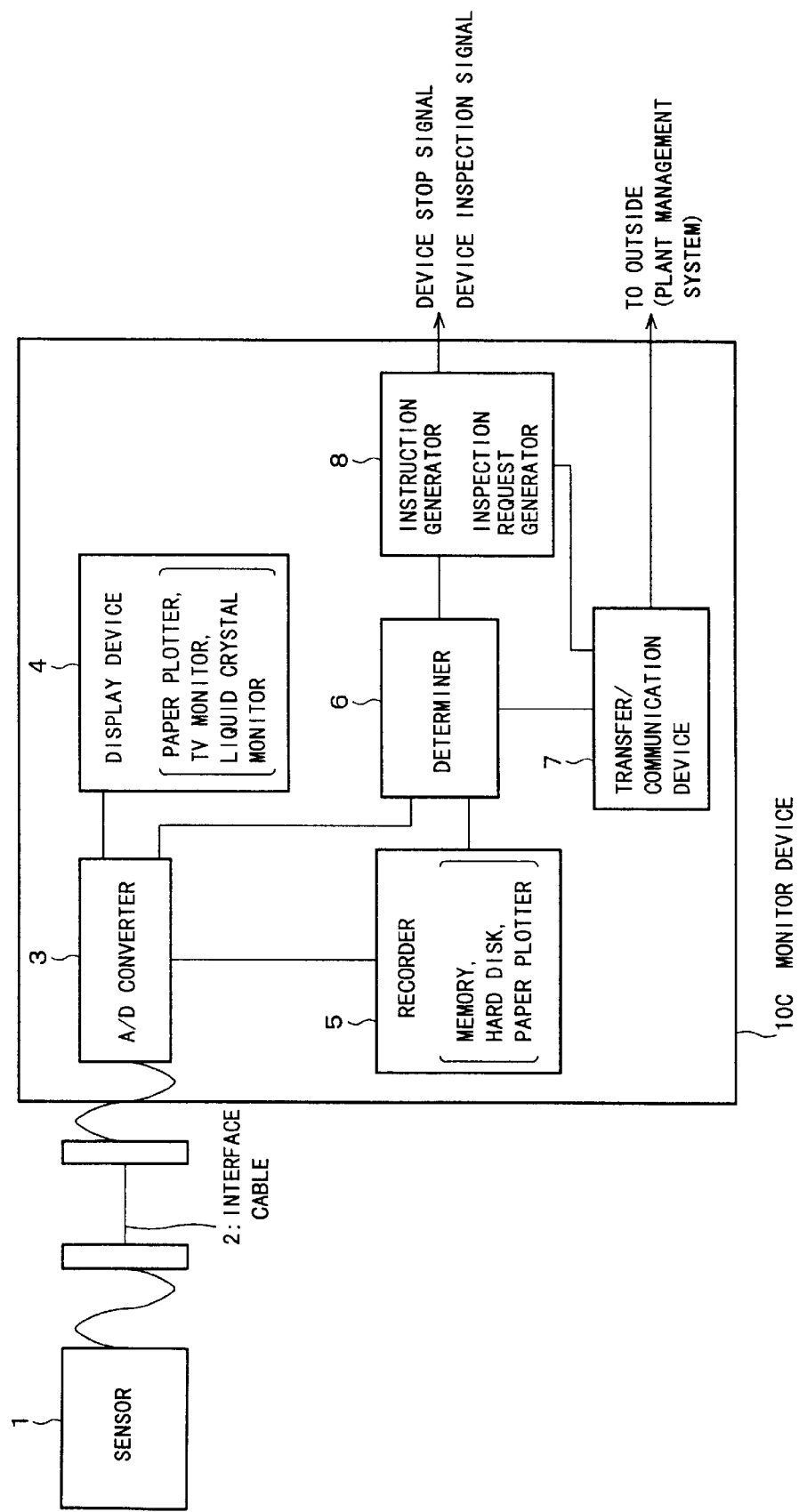
FIG. 3 is a block diagram schematically illustrating an arrangement of still another monitor device provided in the management system for semiconductor fabrication devices shown in FIG. 4.

Next, an arrangement of the monitor device 10 is explained in detail, with reference to FIGS. 1 through 3.

As shown in FIG. 1, in a management system for semiconductor fabrication devices in accordance with the present embodiment, a monitor device 10A (monitor device 10) is connected with a sensor 1 provided in the fabrication device 9 through an interface cable 2. The foregoing monitor device 10A includes an A/D converter (analog/digital converter) 3, a display device 4, and a recorder 5. Note that the foregoing monitor device 10A is a simplified monitor system.

The foregoing A/D converter 3 converts an analog signal that is a data signal supplied from the sensor 1 through the interface cable 2 into a digital signal. The foregoing display device 4 is a paper plotter, a TV monitor, or a liquid crystal monitor, etc. that converts the digital signal supplied from the A/D converter 3 into waveform data and displays the same. The foregoing recorder 5 is a memory, a hard disk, or a paper plotter, etc. for recording the digital signal supplied from the A/D converter 3.

As shown in FIG. 2, the management system for semiconductor fabrication devices in accordance with the present embodiment may use a monitor device 10B in the place of the monitor device 10A. Incidentally, the monitor device 10B is a monitor system to which a function of determination based on waveform comparison is added for the dispersion process while a communication function is added for networking.

The foregoing monitor device 10B is the monitor device 10A further including determiner (monitoring means) 6 for waveform comparison and a transfer/communication device 7 for information transfer. Here, management information data that are always collected by the sensor 1 provided in the fabrication device 9 and are supplied to the monitor device 10B through the interface cable 2 are converted into digital signals by the A/D converter 3. The digital signals are displayed by the display device 4 and are recorded by the recorder 5. Furthermore, the digital signals are, as time-sequential measured value patterns, compared with set value patterns by the determiner 6. The result of comparison by the determiner 6 is transferred through the transfer/communication device 7 to the management computer 13 as an external plant management system. In other words, the management computer 13 manages/controls the fabrication devices 9 and the fabrication process line based on data measured by the sensor 1 (measured data stored in the recorder 5) and the result of comparison by the determiner 6, which are both transferred through the transfer/communication device 7.

As shown in FIG. 3, the management system for semiconductor fabrication devices in accordance with the present embodiment may use a monitor device 10C in the place of the foregoing monitor device 10A or 10B. The monitor device 10C is the monitor device 10B further including an instruction generator (alarming means, defective product identifying means, instruction generating means, instability-causing factor indicating means, maintenance alarm indicating means, second instruction generating means) 8 for generating a device stop signal for instructing stop of the fabrication device 9, or for generating a device inspection signal for instructing inspection of the fabrication device 9. The result of comparison by the determiner 6 is sent to the instruction generator 8 as well as to the transfer/communication device 7. The foregoing instruction generator 8 generates the device stop signal and the device inspection signal based on the result of comparison by the determiner 6, and applies the same to the fabrication device 9.

Incidentally, the foregoing monitor device 10C is a monitor system which is capable of making the fabrication device 9 carry out self-inspection by generating inspection request from the instruction generator 8. Moreover, the instruction generator 8 can be substituted for by the communication function (transfer/communication device 7) of the monitor device 10C. Furthermore, regarding the fabrication devices 9 of the centralized management formula (fabrication device group TGc), the management computer 13 has the function of the monitor device 10C.

Incidentally, each of the monitor devices 10A, 10B, and 10C is hereinafter generally referred to as monitor device 10.

2. Data Determining Method

The following description will explain a data determining method of the management system for semiconductor fabrication devices in accordance with the present embodiment.

The foregoing monitor device 10 plots data into graphs and superimposes the same, so as to determine trends of sequence, stability, and changes with time of waveforms thereof. In other words, the fabrication device 9 is controlled based on recipes (processing procedures, production procedures), and whether or not sequences of waveforms match the recipes can be determined.

Figure 5:
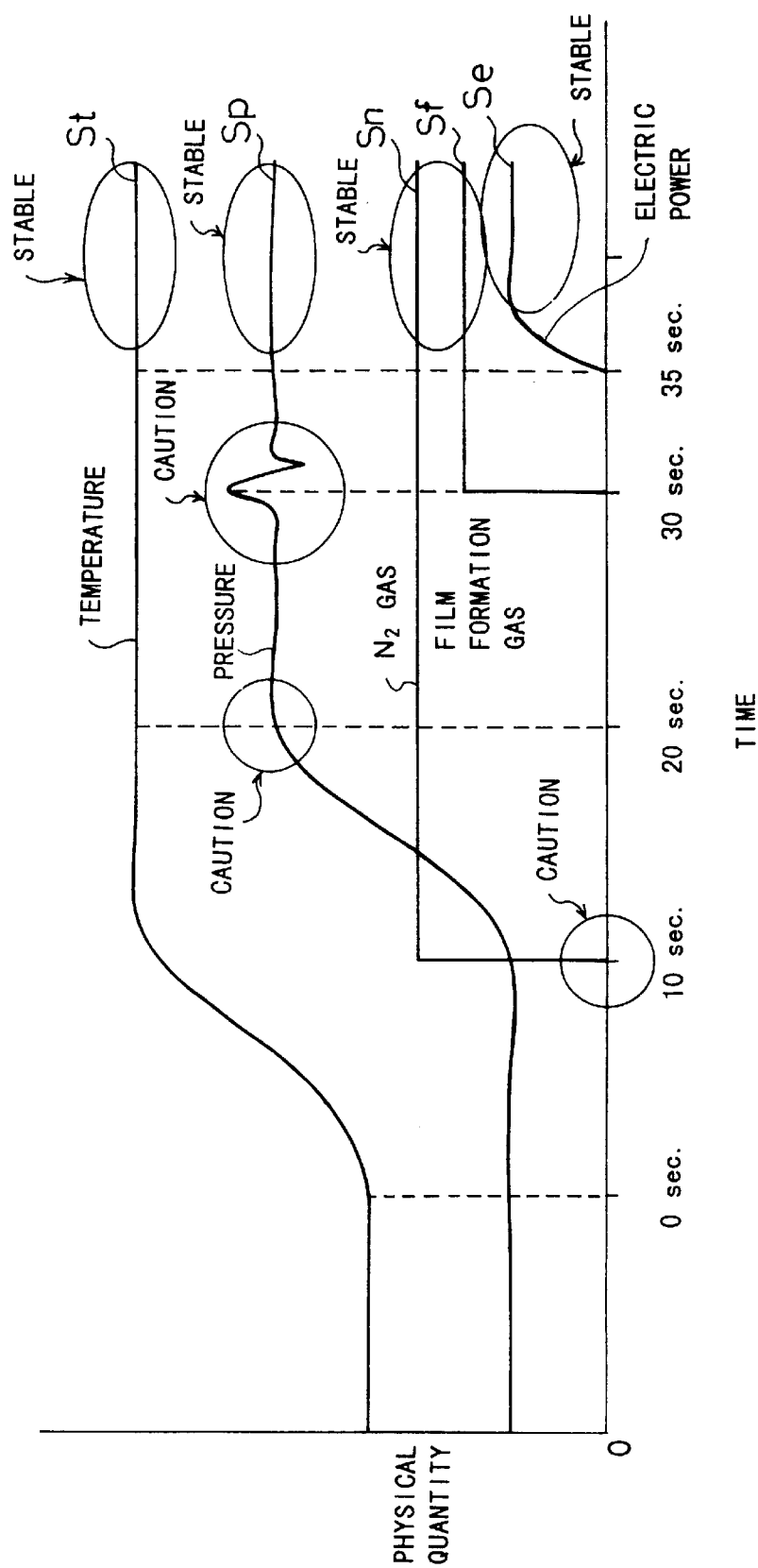
FIG. 5 is an explanatory view illustrating a sequence control carried out by the management system for semiconductor fabrication devices shown in FIG. 4.

FIG. 5 is a graph explaining the sequence control over the fabrication device 9. Contents of the recipe shown in FIG. 5 are as follows: "the process starts at the 0th second; introduction of $N_2$ gas starts at the 10th second; the pressure is stabilized to a film forming pressure by the 20th second; stabilization of a film formation temperature is confirmed; a film formation gas is introduced at the 30th second; and plasma is generated by RF (radio frequency) discharge at the 35th second, whereby film formation starts."

Here, from the graph shown in FIG. 5, it can be determined whether or not the introduction of $N_2$ gas is started at the 10th second, and whether or not the pressure has been stabilized by the 20th second. Determinations about concrete matters are carried out according to time and order.

Further, the stability of waveforms indicate that data about a pressure (Sp), a flow rate of the $N_2$ gas (Sn), a flow rate of the film formation gas (Sf), RF electric power (Se), and a film formation temperature (St) keep stable values during a film formation process (while plasma is being generated).

3. Management Information Reporting Method

The following description will explain a management information reporting method of the management system for semiconductor fabrication devices in accordance with the present embodiment.

Management information can be used for various purposes. Therefore, according to a purpose for which management information is used, contents of report and a reporting method to be applied can be selected.

Figure 6:
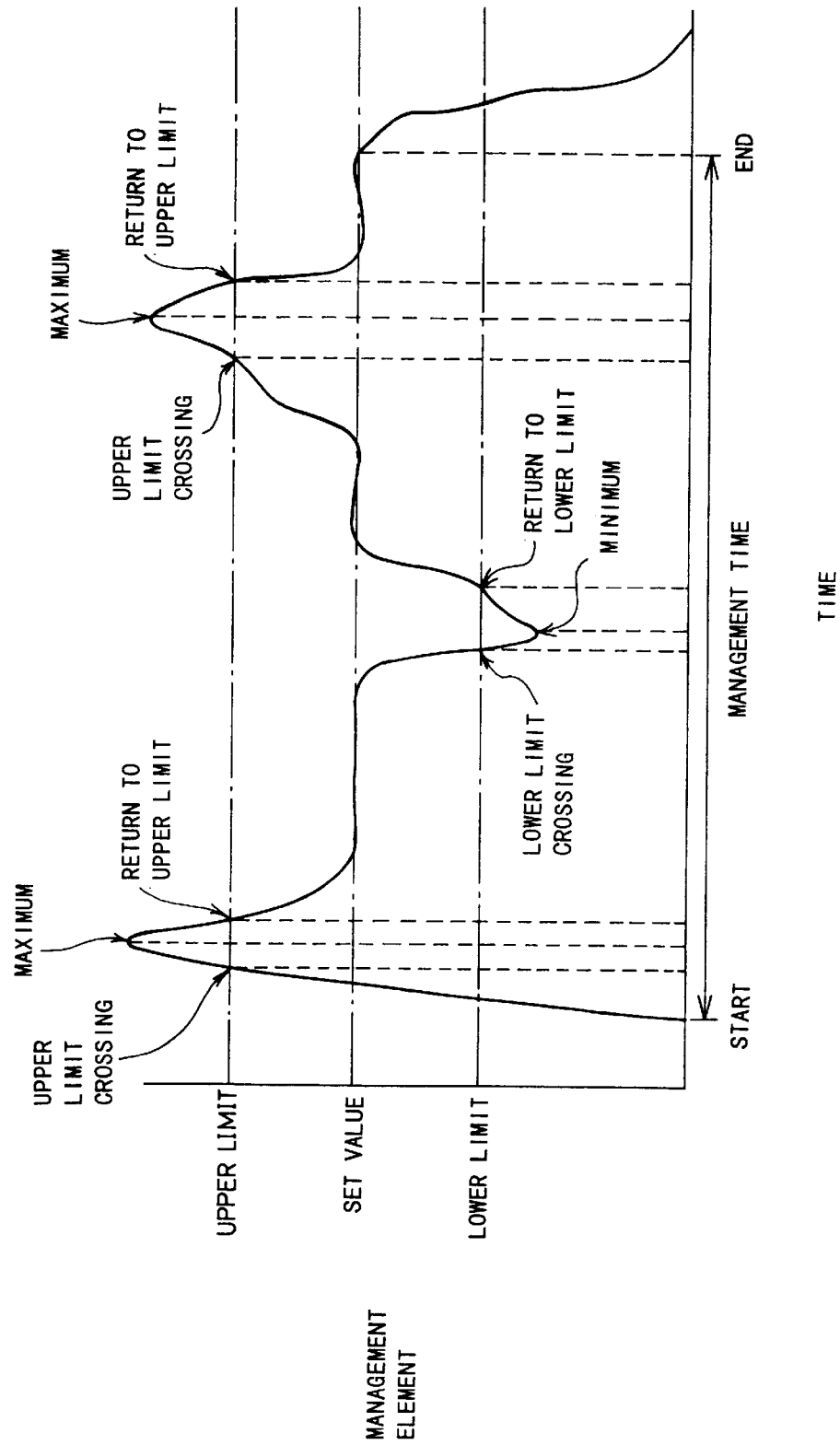
FIG. 6 is an explanatory view illustrating management conducted by the management system of the semiconductor fabrication device shown in FIG. 4, in which the monitoring is carried out at all times with use of an upper limit and a lower limit.

[1] To Raise an Alarm in the Case Where a Measured Value Exceeds a Tolerance Range Proposed as the simplest method is a method in which an alarm is raised when a value exceeding a set tolerance range is measured (see FIG. 6). More concretely, the items to be managed (management element) are always monitored, and when a value measured exceeds a set tolerance range, the time, item, and value of the measurement are reported. Note that the reason why the measured value has exceeded the tolerance range cannot be identified.

Incidentally, this method has been most often used in practical application conventionally. However, in the conventional method, the measured value has been compared with a set upper limit and a set lower limit so that a management table as shown in FIG. 16 was formed.

[2] To Detect an Item of Deviation by Comparing a Measured Waveform With a Waveform of a Theoretical Sequence A theoretical sequence waveform is registered, with which a waveform obtained by measurement can be compared. More concretely, a control start point is confirmed, and the theoretical sequence waveform and the measured waveform are compared. In so doing, a measured waveform that deviates from the theoretical sequence waveform, that is, an item of deviation, is detected and reported.

For instance, in the case where introduction of gas is started 40 seconds after the opening of a gate valve (see FIG. 7(b)) though the start of the gas introduction is set 30 seconds after the gate valve opening (see FIG. 7(a)), deviation of a waveform of the gas introduction can be detected and reported. Likewise, in the case where gas is introduced at a rate of 120 sccm (standard cc/min) for one second (see FIG. 8(b)) though the flow rate of gas is set to 100 sccm (see FIG. 8(a)), deviation of a waveform of the flow of gas can be detected and reported.

Incidentally, "sccm" (standard cc/min) is a unit of flow rate expressing how much in volume the flow is at a constant temperature of 0° C. (or 25° C.) under 1 atm (atmospheric pressure of 1013hPa) per 1 minute. This "sccm" is commonly used for expressing the flow rate of a gas introduced into a vacuum device. Examples of mass flow controllers using sccm as a unit of flow include SEC-F730, SEC-7440, and SEC-400MARK3 available from STEC, MF5100A available from Ohkura Electric Co., Ltd., and CMS20/50 available from YAMATAKE-HONEYWELL Co., Ltd.

[3] To Detect Changes with Time by Comparing Data

Situations of the fabrication process change with time. Therefore, determination of situations in a state where the devices are operating is considered as important in practical application to find such change and calculate a maintenance time beforehand.

Therefore, in a conventional fabrication process, sound of discharge by a pump, a rate of discharge, color of cooling water, a state of rotation of a propeller fan, a gas supply pressure, a pressure in a discharge section, motor driving sound, a state of vibration, a state of a luminous state of plasma, etc. are managed by means of the five senses of human being. In other words, by visual check of states regarding adhesion of reaction products to inside the film forming chamber, degradation of component members, adhesion of reaction products to inside discharge piping, etc. upon maintenance, situations of the device are predicted and component members are replaced. Needless to say, items that can be managed by numerical values are subjected to management by workers engaged in fabricating operations.

However, by using only such data, it is difficult to form a film with uniform in-plain distribution, in set film quality, to a set film thickness. This is because the film forming rate is variable. Incidentally, the reason why the film forming rate is variable is unknown.

To overcome this problem, conventionally, by measuring a film forming rate and feeding the same back to the fabrication device, a reaction time has been controlled, so that the film thickness be controlled. Since variation of the in-plain film thickness distribution has caused critical quality problems, a conventional measurement was such that data obtained before and after a change in the in-plain film thickness distribution were compared, a factor of the change was presumed, and maintenance was repeatedly carried out.

Conversely, in the foregoing management system for semiconductor fabrication devices, changes in measured values with time regarding the fabrication device 9 are grasped and reported by comparing sensor data. For example, in the case where the value of the RF electric power measured every week have changed from 1000W, to 1005W, 1010W, 1015W, and to 1020W (see FIG. 9(b)) though the set value is 1000W (see FIG. 9(a)), changes in the measured data with time are detected. Accordingly, a failure in an electric power controlling device, presence of a component member having electric power loss, changes in the state of the reaction chamber, etc. can be reported as causes of the failure.

[4] To Make the fabrication Device Conduct Self-inspection and Report the Same

By developing the method of determining changes with time, which method is explained in the above [3] section, it is possible to make the fabrication device 9 conduct self-inspection and report the result. More specifically, by making the fabrication device 9 carry out self-inspection at a predetermined point (a predetermined period of time, or for the predetermined number of times during a predetermined period of time) and report the measured data and the data about changes with time, a maintenance timing can be advised.

For example, self-inspection is carried out by the fabrication device 9 at 10:00, or once from 0:00 to 8:00. An achieved vacuum, a discharge rate, a gas discharge rate, a gas flow rate, etc. are subjected to the self-inspection. Then, by detecting changes with time regarding the fabrication device 9 based on the time-sequential data accumulated by the self-inspection, the fabrication device 9 is diagnosed, so that a factor of changes in the measured data is identified. In other words, in the case where the discharge rate decreases, leakage, or decrease of discharge ability of a pump can be regarded as a cause. Therefore, an alarm can be raised to advise necessity of maintenance, by determining a place to be subjected to maintenance and a timing of maintenance.

4. Application of Management Information to Production Management

The following description will explain application of management information to production management by the management system for semiconductor fabrication devices in accordance with the present embodiment.

Based on the management information obtained as above, the following five types of production management can be carried out.

[1] To Manage Defective Products

Defective products can be managed by detecting abnormality in fabrication process data. In other words, as described above, the foregoing management system for semiconductor fabrication devices is arranged so that data obtained during the fabrication process are always subjected to the centralized management (in the case of the fabrication device group TGc) or the dispersed management (in the case of the fabrication device group TGd) (see FIG. 4). This enables identification of a substrate affected by a failure.

[2] To Discover Causes of a Sudden Failure

By always monitoring the fabrication device 9, occurrence of a sudden failure can be confirmed, and a cause, a time, relevance to another factor, a rate of occurrence, distribution of conditions of the occurrence, of the foregoing failure can be presumed based on data. Therefore, by carrying out tests on factors presumed as causes of a sudden failure in a descending order of probability, the causes of the sudden failure can be discovered. This results in efficient selection of measures to cope with the sudden failure.

[3] To Predict Time for Maintenance

By always monitoring each fabrication device 9 and by causing the management computer 13 to follow changes with time in the state of the fabrication device 9, time for maintenance of each fabrication device 9 in the plant can be predicted.

[4] To Stop/Replace Fabrication Devices when Failures Consecutively Occur or When Many Failures Occur In the case where a determination is made based on data obtained by always monitoring the fabrication device 9 as failures consecutively occur or as many failures occur, a device stop signal is outputted from the management computer 13 to the fabrication device 9 to stop the fabrication device 9, so that losses by the failure are suppressed. Here, along with data graphs, presumed causes of failures can be shown to workers in a descending order of probability. It is also possible to show an inspection method and a determination method to the workers.

Thus, not only the fabrication device 9 can be stopped/replaced, but also probable causes of the failures can be limitedly identified and shown to the workers along with the measures to be taken.

[5] To Shorten Redundancy Time

By measuring as redundancy time a time since the process state is stabilized until the next sequence starts based on data of the fabrication process and by generating an instruction for shortening the redundancy time by changing the sequence control over the fabrication device 9, the redundancy time can be shortened. This ensures improvement of the production efficiency.

Figure 15:
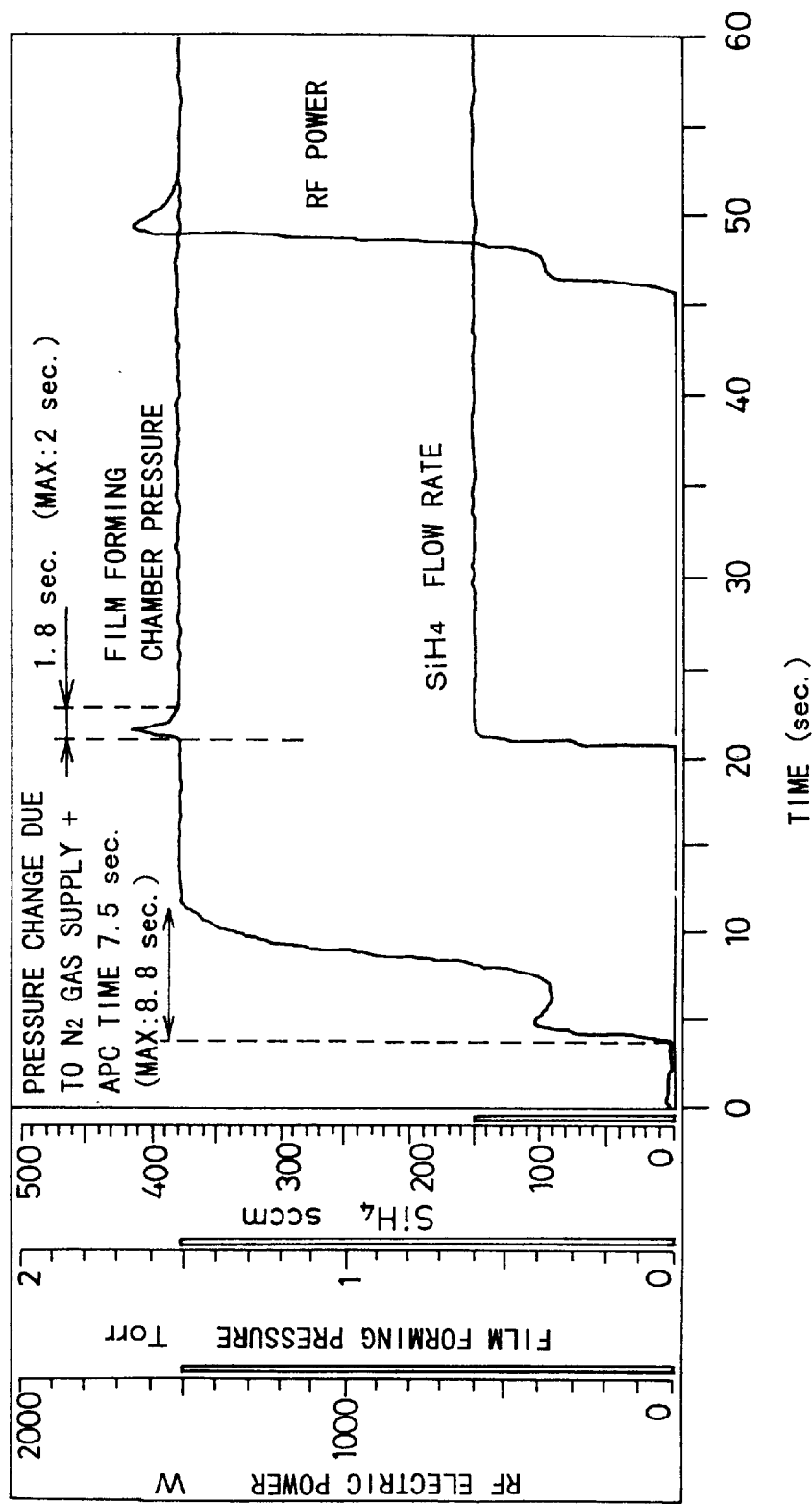
FIG. 15 is a view for explaining another example in which the management system for semiconductor fabrication devices shown in FIG. 4 is applied to the liquid crystal substrate fabrication process line. The view is a graph showing analysis of stability since the introduction of $N_2$ gas at start of formation of a gate insulator layer and an intrinsic semiconductor layer until turning on of RF electric power in a CVD device.

Here, the shortening of the redundancy time is concretely explained, with reference to FIG. 15. A pressure in the film forming chamber becomes stable within at most 8.8 seconds since start of introduction of $N_2$ gas. Thereafter, for about 10 seconds until introduction of $SiH_4$ gas, the stable state of the film forming chamber pressure is maintained. Accordingly, this period of about 10 seconds can be shortened as redundancy time. The film forming chamber pressure becomes stable within at most 2 seconds after the introduction of $SiH_4$ gas. Since the stable state of the film forming chamber pressure is thereafter maintained for about 25 seconds until start of application of the RF power, this period of about 25 seconds can be shortened as redundancy time. In other words, the sequence shown in FIG. 15 can be rearranged so that: $SiH_4$ gas is introduced 8.8 seconds after the introduction of $N_2$ gas, and 2 seconds thereafter, the application of the RF power is started. Consequently, the redundancy time can be shortened by about 28 seconds.

5. Method of Presumption and Confirmation of Causes Based on Data

The following description will explain methods of presumption and confirmation of causes of failures based on management information data by the management system for semiconductor fabrication devices in accordance with the present embodiment.

[1] Method for Discovering a Cause of a Sudden Failure

A value of change from a set control value, and an item of control can be confirmed from management information data. For example, in the case where the pressure is reduced to 0.9 Torr for 3 seconds though the set pressure is 1.2 Torr, a cause of changes in characteristics of products can be presumed to be production of a reaction product having a characteristic of a 0.9 Torr state.

[2] Method for Discovering a Cause of a Failure From Changes With Time

By determining trend changes and cyclic changes based on data about changes with time, degradation of component members used can be discovered. For example, from changes in electric power, degradation of component members causing electric power loss can be presumed.

[3] Method for Managing Sequence in Time Order

Assume that, for example: though the RF electric power is to be applied after introduction of $N_2$ gas and stabilization of the flow thereof to 100 sccm, the RF electric power application start time cannot be controlled, and the RF electric power is applied when the gas flow rate is at 50 sccm before becoming stabilized. In this case, due to the state in which the flow of $N_2$ gas is unstable in a range of 50 sccm to 100 sccm, defective products are produced. This cause of a failure is more difficult to be discovered than that of a sudden failure since the time order of factors to be controlled is important. Consequently, it is required to accumulate data at all times.

With the foregoing arrangements, the management system for semiconductor fabrication devices in accordance with the present embodiment enables the following.

[1] To Determine Whether or Not the Fabrication Device is Stably Operating

By collecting data at all times, a degree of stability and variability of the fabrication device 9 can be checked based on the data. More specifically, which factor is stable and which factor is unstable can be determined, factors of instability can be limitedly identified, and the device can be modified by process changing. In so doing, stable operations of the fabrication process can be maintained.

[2] To Discover Causes of a Sudden Failure

Conventionally, without sufficiently discovering causes of a sudden failure, a production process is restored since priority is given to production. The reason is that occurrence of sudden failures is random and that data about causes of such failures are absent, or if any, only records of events are available.

Conversely, the foregoing management system for semiconductor fabrication devices is arranged so as to be capable of immediately discovering causes of a sudden failure and of taking suitable measures by taking records in a form of waveform data at all times. Consequently, by applying adjustment and modification to the fabrication device 9 to eliminate such causes of a sudden failure, a high yield can be achieved.

[3] To Decrease Production Costs

Conventionally, distinction of defective products from non-defective products is carried out in an inspection process. In other words, the fabrication process proceeds in a state where both non-defective products and defective products are present. Here, inevitably, washing water, chemical liquid, and gas are used during the foregoing process, while electric power and compressed air are used to cause the fabrication device 9 to operate. In short, these resources are wasted for defective products.

Conversely, with the foregoing management system for semiconductor fabrication devices, it is possible to decrease production costs since a substrate affected by a failure is identified and removed in real time, thereby not being forwarded to the next process.

[4] To Conduct Maintenance in an Optimally Efficient Cycle by Calculating Maintenance Time From Data about Changes With Time To improve productivity and to decrease production costs, a period of time (production time) while the fabrication device 9 is directly engaged in production need approximate to a total time while the fabrication device is operable.

The total time while the fabrication device 9 is operable can be expressed by the following formula:

TOTAL TIME=PRODUCTION TIME+WAITING TIME+QUALITY CONTROL TIME +MAINTENANCE TIME+TROUBLE CORRECTING TIME

For example, with operability of 24 hours, the total time is as follows:

TOTAL TIME=1440 min.

Here, the foregoing maintenance time is a regular maintenance time required for one day in average. For example, in the case where maintenance need be carried out once a week, 2 hours each time, the maintenance time is as follows:

MAINTENANCE TIME=12×60÷7=103 min.

The foregoing trouble correcting time is a time spent in maintenance to correct a trouble or in a confirmation test in the case where a problem of quality is raised or a malfunction of the fabrication device 9 occurs. Here the trouble correcting time is set as follows:

TROUBLE CORRECTING TIME=210 min.

The foregoing quality control time is a time spent in conducting tests and in controlling quality of products based on the measured data. For example, in the case where once a three days, three hours each time, are required, the quality control time becomes as follows:

QUALITY CONTROL TIME=3×60÷3=60 min.

The foregoing waiting time is a time originating from an average transport loss time as well as non-efficient processing procedure. In other words, the transport loss time is a time in a state in which a matter to be produced is absence, in a state of being transported in/out, and in a state in which transport is suspended since a place as a destination of a product has no vacancy. Thus, during the transport loss time, the fabrication device 9 is in a waiting state. Besides, in the case where planed distribution of materials in accordance with the processing time is disordered due to a trouble having occurred to a previous process (in the case where the flow of products is made random), the transport loss time is generated. For example, take as an example a process in which one product is produced per hour. In the case where a previous process is stopped for three hours due to a trouble, the process subsequent to the process having a trouble is left in a waiting state for three hours. In the case where three products are transported thereto at the same time, two out of them are left in a waiting state. Thus, productivity is deteriorated. Here, let the waiting time be as follows:

WAITING TIME=60 min.

Consequently, a production time while the fabrication device 9 is directly engaged in production is as follows:

PRODUCTION TIME=TOTAL TIME-WAITING TIME-QUALITY CONTROL TIME -MAINTENANCE TIME-TROUBLE CORRECTING TIME =1440-60-60-103-210 min.=1007 min.

Thus, the 1007 minutes is a time while the fabrication device 9 is directly engaged in production. Approximating the production time, which is now 1007 minutes, to the total time, which is 1440 minutes, will lead to improvement of productivity and reduction of production costs.

Here, the foregoing waiting time can be shortened by solving a transport problem and a problem in a plant operating system.

The foregoing quality control time is necessary in the present state, but it has been discovered that it can be omitted by adopting a monitoring system using another scheme. For example, to inspect all the sheets of substrates by providing an inspection process after every process is the simplest solution.

The foregoing maintenance time can be shortened by modification of the fabrication device 9, but maintenance itself is imperative. In the present state, data are compared by a test operation or a production operation, and the maintenance time is set in accordance with the number of processed substrates, processing days, processing power, etc. Regarding this aspect, conversely, the foregoing management system for semiconductor fabrication devices allows the operation costs to decrease, by efficiently collecting data at all times and by setting optimal maintenance timings according to situations.

The foregoing trouble correcting time is the most difficult to reduce, and since troubles are conventionally corrected by non-efficient techniques, the production plan is severely adversely affected. The reason is that consecutively-collected data around occurrence of a trouble are not available. Conventionally, a reproduction test is carried out, and in the case where no abnormal event occurs, the production process is resumed. Furthermore, in the case where an abnormal event occurs in a reproduction test but sensors do not detect abnormality, maintenance is repeatedly carried out. In the case where the operation of the fabrication device is found to be stable and a result of quality inspection exhibits no problem, the production process is resumed. In other words, conventionally, the production is continued without clarifying a cause of a trouble. In this aspect, conversely, the management system for semiconductor fabrication devices is capable of calculating maintenance timings from the data about changes with time, and hence carrying out maintenance in an optimally efficient cycle.

Consequently, the above-described management system for semiconductor fabrication devices enables; first of all, to distinguish a sudden failure from a failure due to degradation; secondly, to clarify a cause of a failure; and thirdly, to reduce the trouble correcting time, thereby enhancing the productivity.

[5] To Execute Sheet-by-Sheet Management During Production

Since every sheet of substrate being produced is managed by the foregoing management system for semiconductor fabrication devices, sheet-by-sheet quality control, device control, maintenance control, and defect analysis control can be carried out by the plant management system.

The following description will explain an example in accordance with the present embodiment, in which the management system for semiconductor fabrication devices of the present invention is applied to a liquid crystal substrate fabrication process, while referring to FIGS. 10 through 15.

[1] Outline of Management System

① To determine states of the fabrication devices 9 and situations of production in the liquid crystal substrate fabrication process, sensors to detect a temperature, a moisture, a concentration, a pressure, a gas flow rate, electric power, sequence electric signals, mechanical electrical indices, etc. were provided to each fabrication device 9 (see FIG. 4) so as to collect a variety of waveforms at all times.

More specifically, 2 sensors for measuring a pressure in the film forming chamber, 5 sensors for measuring a gas flow rate, 3 sensors for measuring RF electric power (progressive wave set value, progressive wave, reflected wave), and 1 sensor for detecting opening/closing of a valve, that is, 11 sensors in total, were provided in the fabrication device 9, and monitoring was carried out.

② By using a converter for converting electric signals to waveform data, sampling was carried out with a resolution of 12 bit and in a cycle of 0.1 second. A resolution in a range of 12 bit to 16 bit was adequate for the sampling, but the processing with a resolution of 12 bit was optimal from viewpoint of performance and cost reduction.

In the case where 12-bit data are treated as 16-bit (2-byte) records for the sake of data processing, a quantity of data processed in one day is as follows in the case where the sampling cycle is 0.1 second and the number of data sampled per cycle is 16:

DATA PROCESSED IN ONE DAY=2 BYTE×16 DATA/0.1 sec.× 60 sec.×60 min.×24 hr.=27 MB

Furthermore, in the case a data storage time is from 2 to 3 months, the capacity that a storing device requires is as follows:

27MB×60 DAYS TO 27MB×90 DAYS=1.62GB TO 2.43GB

Accordingly, the storing device preferably has as great a capacity as possible, but actually a storing device having a capacity of about 2GB will do.

③ Based on the variety of waveform data thus measured, mutual relationship between the waveform data is inspected, and comprehensive management is executed. First, the waveforms are reviewed on t he time base (sequence is examined) Secondly, the waveforms are reviewed on the numerical base so that stable values (or unstable values) of the waveforms are examined. Thirdly, reproductivity in repetition of production is examined.

In so doing, an optimal set value can be selected by comparing the waveform data. Here, the optimal set value is a value which enables maximization of production when the sequence timing is arranged so as to stabilize the quality of products.

[2] A Sensor Signal Waveform Monitoring Method and a Fabrication Device Management Method In a process of fabrication of TFT (thin film transistor) liquid crystal substrate, to always monitor sensor signals of the sensor 1 provided in the vacuum film forming device (fabrication device 9), electric signals were detected and voltage signals were converted into monitored values (film forming pressure, RF electric power, gas flow rate, etc.) and were plotted into sensor signal waveforms. The sensor signal waveforms thus obtained were monitored, so that the signal waveforms were managed from their rises until their falls.

Figure 10:
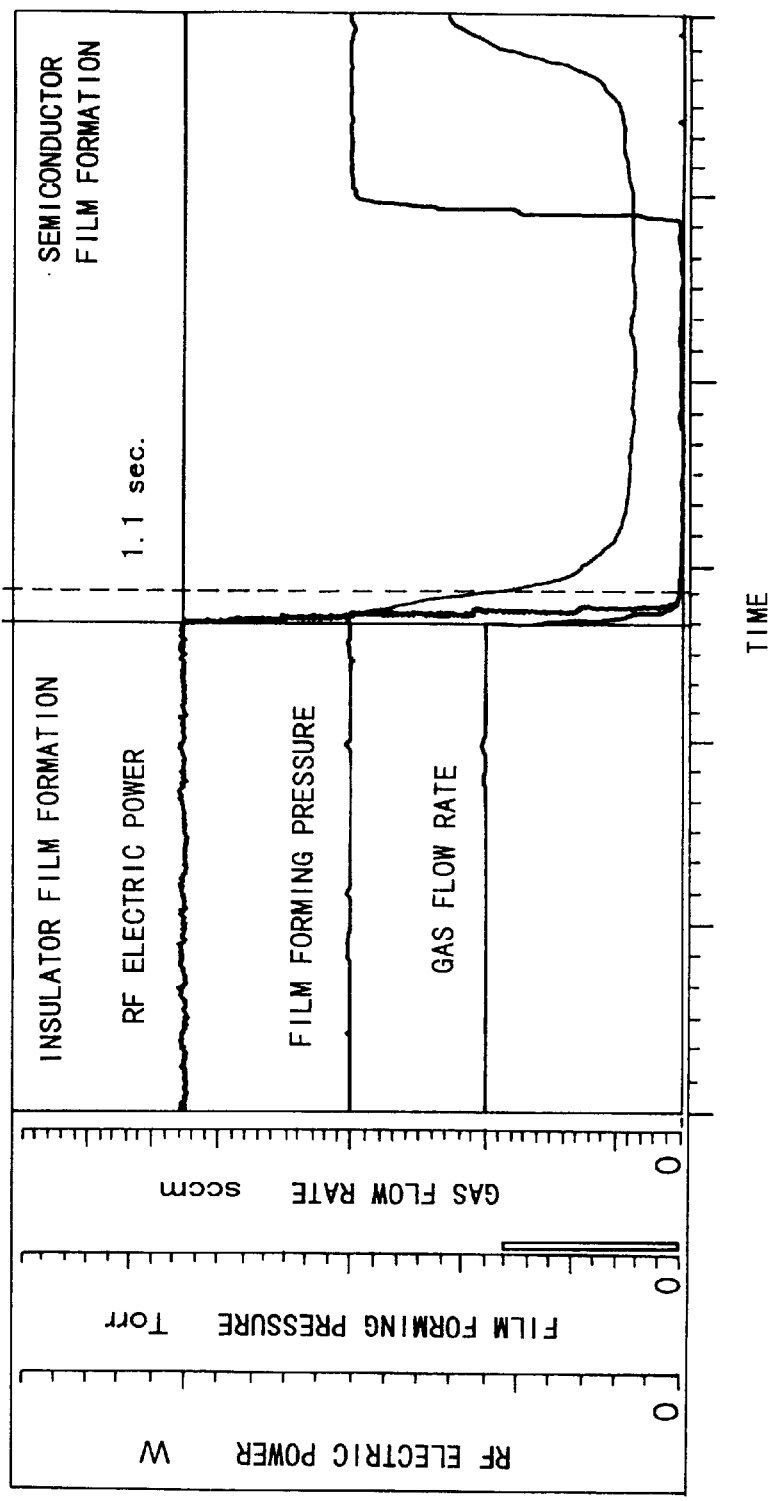
FIG. 10 is a view for explaining an example in which the management system for semiconductor fabrication devices shown in FIG. 4 is applied to a liquid crystal substrate fabrication process line. The view is a graph showing measured values in a process of formation of an insulator film and a semiconductor film in a vacuum thin film deposition system.
Figure 11:
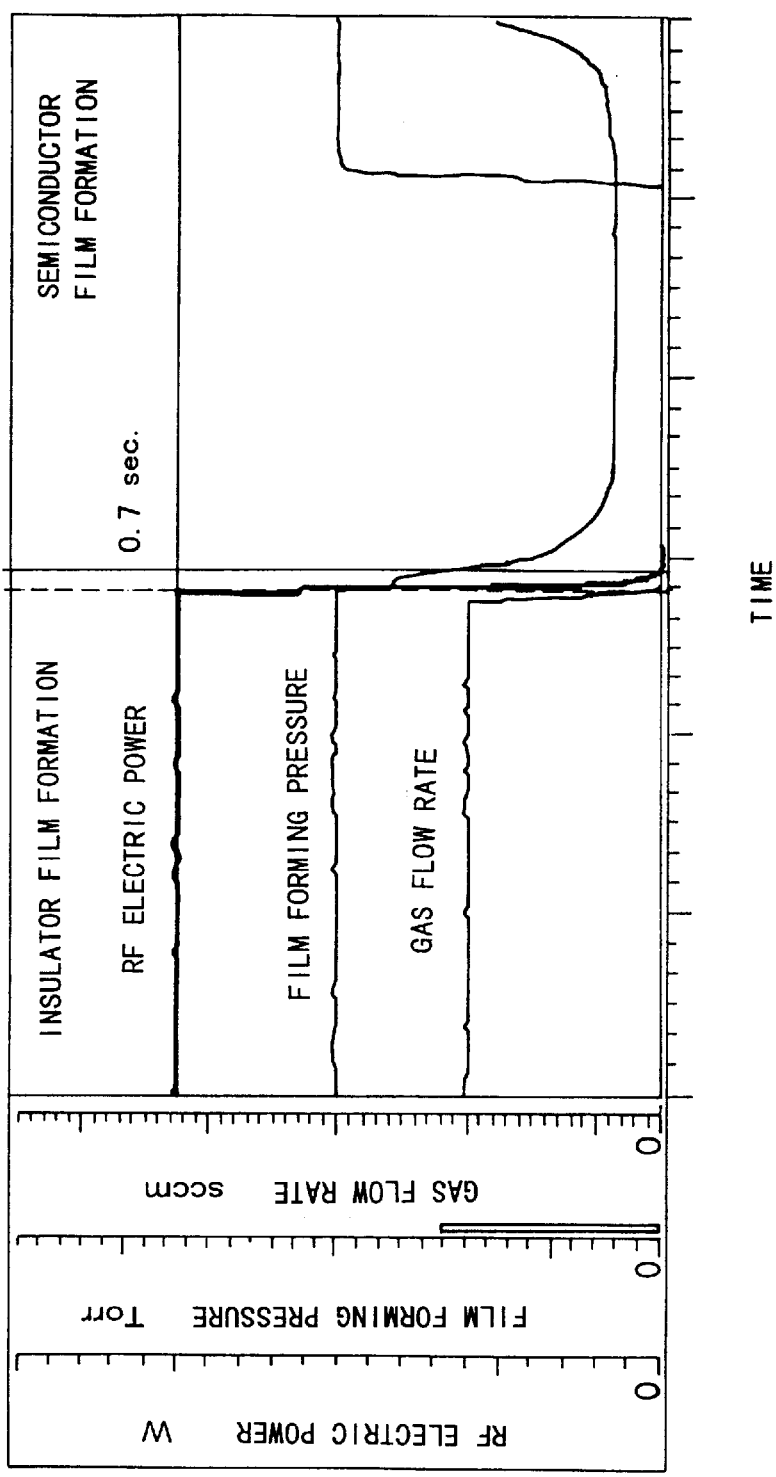
FIG. 11 is a view for explaining the example in which the management system for semiconductor fabrication devices shown in FIG. 4 is applied to the liquid crystal substrate fabrication process line. The view is a graph showing measured values in a process of formation of an insulator film and a semiconductor film in a vacuum film forming device.

As illustrated in FIGS. 10 and 11, variations of the control sequence at an end of the insulator film forming process were examined, by monitoring the film forming process of the insulator film and the semiconductor film. Here, a variation of the control sequence in FIGS. 10 and 11 refers to a phenomenon in that a fall of the waveform of the gas flow rate that should appear at the same time as a fall of the RF electric power is advanced to the fall of the RF electric power (FIG. 11), though the RF electric power and the gas flow rate are set so as to simultaneously change (FIG. 10).

In FIG. 10, when the RF electric power fell, the gas flow rate had not yet fallen, which means that gas was still introduced at the time. Conversely, in FIG. 11, when the RF electric power fell, the gas flow rate had completely fallen, which means that substantially no gas was introduced. Therefore, in the case of FIG. 11, a film was formed under conditions different in the gas flow rate, that is, the gas mixture ratio from those in the case of FIG. 10. Therefore, it is obvious from FIG. 11 that on the desired insulating film, another film having a different property was formed.

To eliminate such variation of the control sequence as shown in FIGS. 10 and 11, for example, in the case of FIG. 10, the sequence setting time can be derived as follows from data about the variation of the timing of the fall of the RF electric power and the variation of the timing of the fall of the gas flow rate:

SEQUENCE SETTING TIME=1.1 sec. FOR RF ELECTRIC POWER FALL+0.3 sec. FOR VARIATIONS OF GAS FLOW RATE FALL TIMING=1.4 sec.

More specifically, a set of sequences of stopping the RF electric power, then, after 1.4 seconds, stopping the gas flow may be prepared. Regarding this, from the viewpoint of production tact, the sequence setting time may be set to the minimum of 1.4 second. Incidentally, since the length of the sequence setting time is peculiar to each fabrication device 9, that of each fabrication device 9 is measured and set.

Figure 12:
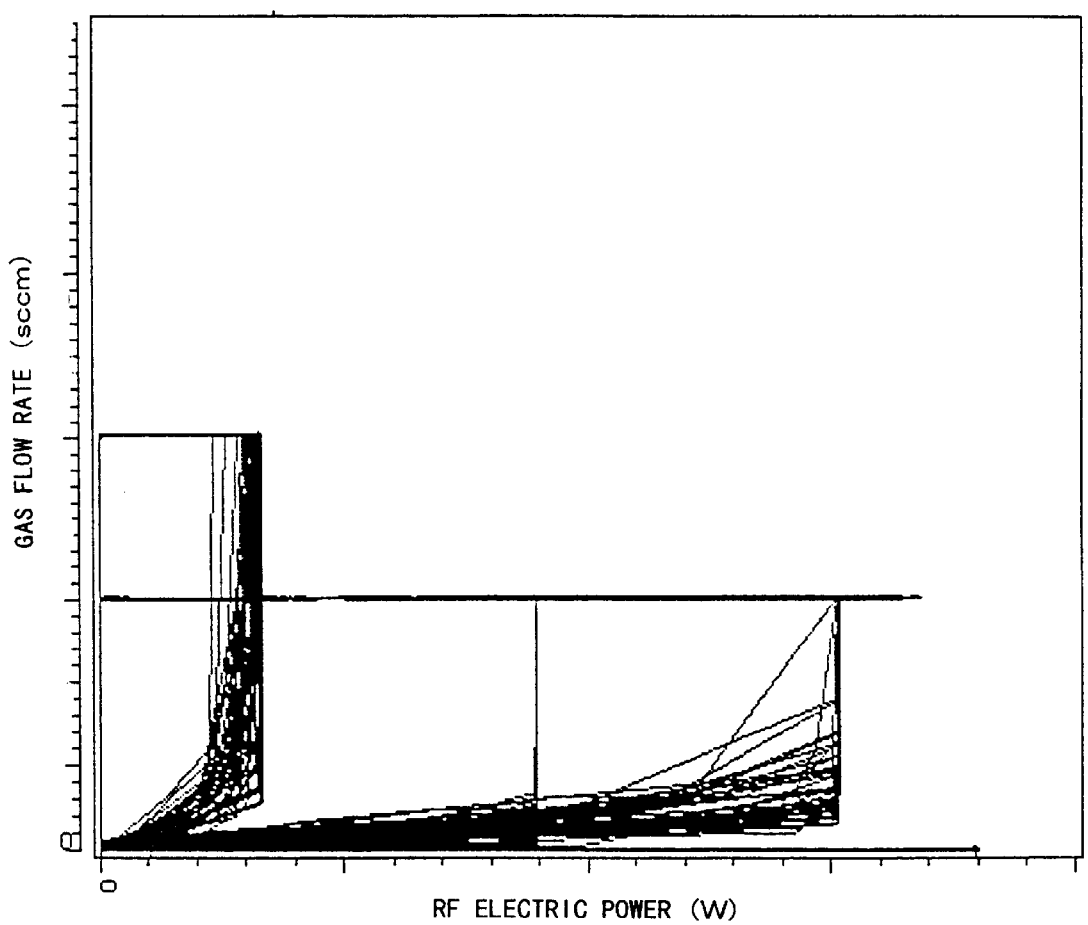
FIG. 12 is a view for explaining the example in which the management system for semiconductor fabrication devices shown in FIG. 4 is applied to the liquid crystal substrate fabrication process line. The view is a graph showing relationship between RF electric power and a gas flow rate before changing the sequence of formation of an insulator film and a semiconductor film in a vacuum film forming device.

FIG. 12 is a graph illustrating relationship between the RF electric power and the gas flow rate before the foregoing sequence change, from which variations of the gas flow rate fall and the RF electric power fall can be recognized.

On the other hand, FIG. 13 is a graph illustrating relationship between the RF electric power and the gas flow rate after the foregoing sequence change, from which it can be recognized that the relationship between the RF electric power and the gas flow rate is stabilized by the changed sequence. In other words, by changing the sequence, the variation depending on the fabrication device 9 could be suppressed, resulting in enhancement of the quality of products.

Thus, by the sequence setting by monitoring the sensor signal waveforms of the fabrication device 9 and controlling the signal waveforms from the rise to the fall, the variation of sequence that is a factor causing instability of the fabrication process could be eliminated.

[3] To Provide a RF Electric Power Progressive Wave Sensor, a Gas Flow Rate Sensor, and a Film Forming Chamber Pressure Sensor in a CVD Device In the case where a CVD (chemical vapor deposition) device in the liquid crystal substrate fabrication process is monitored by means of electric control waveform signals, only a RF electric power progressive wave sensor, a gas flow rate sensor, and a film forming chamber pressure sensor may be provided to monitor the waveform data at falls thereof.

With this arrangement, sensor signals of the CVD device were monitored, to catch falls of the signal waveform data. Consequently, variations of the sequence upon the fall of the waveforms were recognized.

As described above, before the sequence change, variations of the fall of the gas flow rate and variations of the fall of the RF electric power were recognized (see FIG. 12). Conversely, it was recognized that after the sequence change, the relationship between the RF electric power and the gas flow rate became stable (see FIG. 13). In other words, by changing the sequence, the variation depending on the fabrication device 9 could be suppressed, resulting in enhancement of the quality of products.

Thus, in the case where a CVD device in the liquid crystal substrate fabrication process is monitored by means of electric control waveform signals, only a RF electric power progressive wave sensor, a gas flow rate sensor, and a film forming chamber pressure sensor may be provided to monitor the waveform data at falls thereof. By the sequence setting by monitoring the sensor signal waveforms of the fabrication device 9 and by managing the signal waveforms from the rise to the fall, the variation of sequence, which is a factor causing instability of the fabrication process, could be eliminated.

[4] Process State Monitoring

① CVD Device Process State Monitoring Situations

The management system for semiconductor fabrication devices of the present invention is suitable as a process state monitor to be applied to a film forming chamber for forming a gate insulator layer (GI layer) and an intrinsic semiconductor layer (i layer) in the CVD device. More specifically, it is effective as an analysis tool for optimizing control timings while checking the stability of the process control state, by continuously accumulating data about transitional changes of the RF electric power, a film forming pressure, respective gas flow rates, stability in a steady state, and control timing variations, etc. that may affect the quality of a formed film and the like. Incidentally, the gate insulator layer is a layer formed to insulate a gate. The intrinsic semiconductor layer is a semiconductor layer used for ON/OFF control of electricity by means of carriers.

Figure 14:
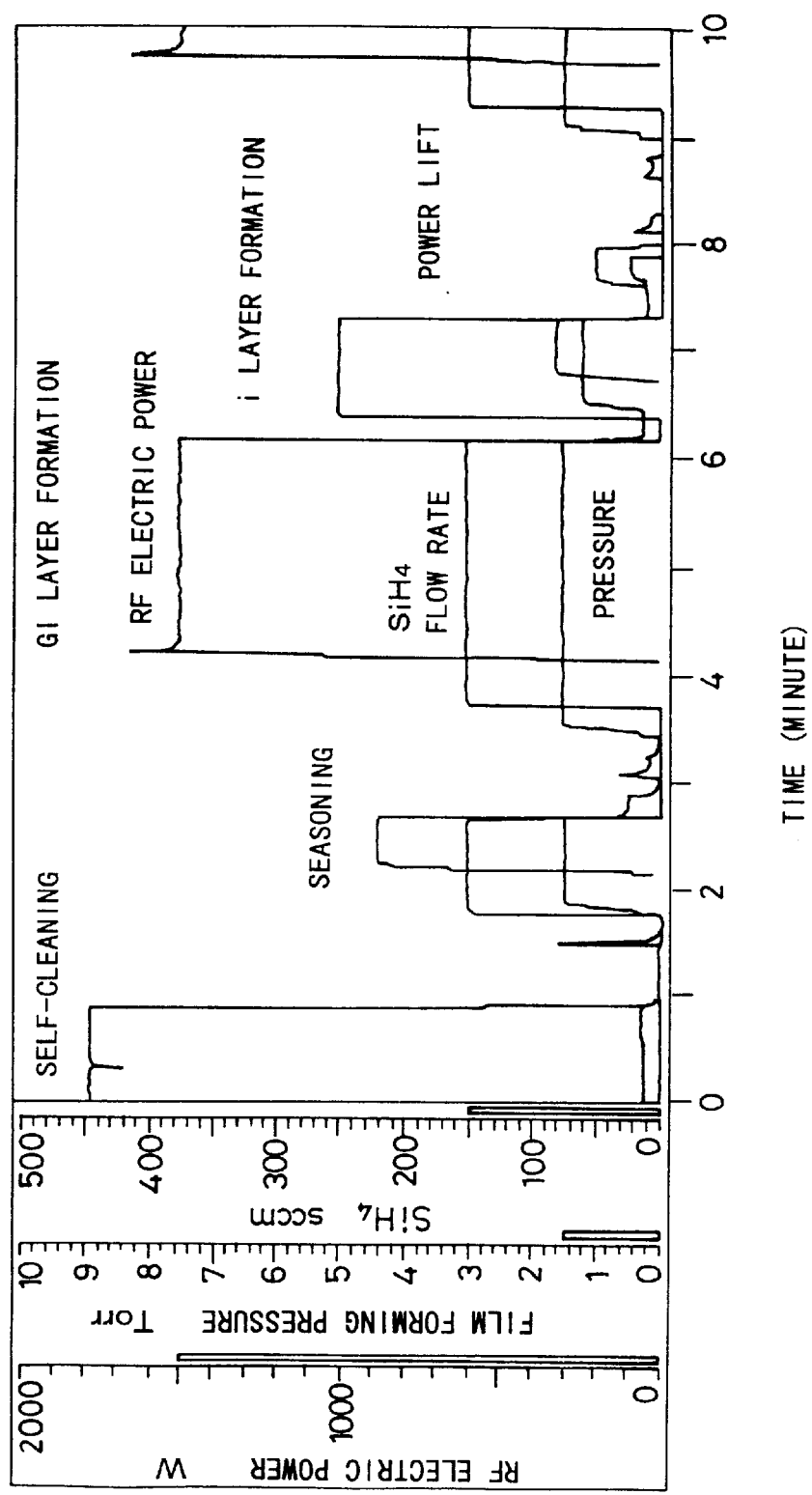
FIG. 14 is a view for explaining another example in which the management system for semiconductor fabrication devices shown in FIG. 4 is applied to a liquid crystal substrate fabrication process line. The view is a graph showing measured values of RF electric power, a pressure, and a $SiH_4$ gas flow rate during formation of a gate insulator layer and an intrinsic semiconductor layer in a CVD device.

FIG. 14 illustrates an example of a result of the monitoring of changes in the RF electric power, a film forming pressure, and a $SiH_4$ gas flow rate upon the formation of the gate insulator layer and the intrinsic semiconductor layer.

② Analysis of Stability Since the Introduction of $N_2$ Gas at Start of GI Layer/i Layer Formation Until Turning on of RF Electric Power As shown in FIG. 15, the time since the supply of $N_2$ gas until stabilization to the set pressure, that is, the time while the film forming chamber pressure was drastically changed by supply of the $N_2$ gas and became stabilized to the set pressure by automatic pressure control (APC), was 7.5 seconds. Incidentally, a maximum value of the time was 8.8 seconds.

The time needed for a change occurring to the film forming chamber pressure at the start of introduction of $SiH_4$ gas to fade out resulting in restoration of a stable state was 1.8 seconds. Note that a maximum value of the time was 2 seconds.

Here, in the present example, the maximum value (maximum time) until stable states of respective sequences are restored is determined based on 16 pieces of data. The method for determining the maximum time may not be limited to the aforementioned one, and any method appropriate may be chosen. For example, the number of data subjected to analysis is not limited to 16, but may be 50, 100, the number of data obtained in one day, or the number of data obtained in several months.

Then, a transient response is examined based on a result of the foregoing measurement. In other words, with view to stability and quickening, the control method and the response function are examined, and the degree and coefficient of the feedback function can be adjusted. This enables to shorten the production time in association with the transient response as well, thereby enabling enhancement of the productive efficiency.

As shown in FIG. 15, analyzing the timing of stabilization of the process gas supply at the start of film formation and the timing to turn on the RF electric power with regard to the CVD device, and assuming an actual time needed for stabilizing a state after the introduction of $SiH_4$ gas as the film forming chamber pressure variation time, it was recognized that the RF electric power was turned on after stabilization of the $N_2$ and $SiH_4$ gas introduction upon the formation the gate insulator layer and the intrinsic semiconductor layer.

③ Processing State Monitor Data Upon Formation of the Gate Insulator Layer and the Intrinsic Semiconductor Layer Since variations were recognized in control timings to turning off the RF electric power and the $SiH_4$ gas flow upon end of formation of the gate insulator layer, an effect of a sequence to stabilize and stop $SiH_4$ gas flow after the turning off of the RF electric power was confirmed.

Finally, a management system for semiconductor fabrication devices in accordance with the present invention may be arranged so as to include (i) a sensor for always collecting management information from a fabrication device provided in a semiconductor fabrication process line, (ii) monitoring means for monitoring the management information collected by the sensor as a time-sequential measured value pattern, and for comparing the measured value pattern with a set value pattern registered beforehand in accordance with the management information, and (iii) alarming means for indicating occurrence of a failure in the case where deviation of the measured value pattern from the set value pattern is detected as a result of the comparison by the monitoring means.

According to the foregoing arrangement, in the semiconductor fabrication process line, to check each fabrication device and the fabrication state, sensors for detecting various kinds of management information are provided in each fabrication device, and waveform data obtained are always measured. The monitoring means is caused to confirm a control start point and to compare the measured value pattern with the set value pattern. In the case where a deviation of the measured value pattern from the set value pattern is detected, a corresponding management item is indicated by the alarming means. For example, in the case where a failure occurs to the semiconductor fabrication device, the device stop signal can be outputted to the fabrication device based on the output of the alarming means, so that the fabrication device be stopped.

The management system for semiconductor fabrication devices in accordance with the present invention may be further arranged so that the monitoring means compares the measured value pattern with the set value pattern during a period of time in which a certain steady state of the fabrication device shifts to a next different steady state thereof.

With the foregoing arrangement, the comparison of the measured value pattern of the sensor signal of the fabrication device is carried out during a period of time in which a certain steady state of the fabrication device shifts to a next different steady state thereof (during a period of time corresponding to a rise or a fall of the signal waveform).

This enables to detect variations of the control sequence, including a phenomenon such that two items to be managed which should simultaneously vary actually vary with a time lag.

The management system for semiconductor fabrication devices in accordance with the present invention may be arranged so as to further include defective product identifying means for identifying a defective product on the fabrication process line based on a result of the comparison by the monitoring means.

With the foregoing arrangement, a defective product on the fabrication process line can be identified in real time by the defective product identifying means based on the result of the comparison by the monitoring means, and the defective product can be removed.

Consequently, the foregoing management system for semiconductor fabrication devices does not allow the defective product to be sent to the process in the downstream side, thereby preventing resources such as washing water, chemical liquid, gas, electric power and compressed air from being wasted in application of usual processing operations to the defective product. This results in reduction of the production costs.

Incidentally, since the foregoing management system for semiconductor fabrication devices is capable of maintenance of each sheet of substrates on the fabrication process line, it is possible to executed sheet-by-sheet quality control, device control, maintenance control, and defect analysis control.

The management system for semiconductor fabrication devices in accordance with the present invention may be arranged so as to further include instruction generating means for instructing adjustment of a sequence of the fabrication device based on a result of the comparison by the monitoring means, so as to eliminate a deviation of the measured value pattern from the set value pattern.

With the foregoing arrangement, based on the result of comparison by the monitoring means, sequence timing can be set so that stability of quality is ensured while the quantity of production is maximized. Then, by setting optimal set values for the sequence of the fabrication device based on the instruction by the instruction generating means, variation by the fabrication device can be suppressed, thereby resulting in enhancement of production quality.

Particularly, by carrying out the sequence setting by managing the signal waveform from a rise to a fall thereof, variation of the sequence that is a factor causing instability of the fabrication device can be easily detected.

The management system for semiconductor fabrication devices in accordance with the present invention may be arranged so as to further include instability-causing factor indicating means for detecting instability of the measured value pattern and for indicating presumed factors causing the instability, based on a result of the comparison by the monitoring means.

According to the foregoing arrangement, the instability-causing factor indicating means determines whether the fabrication conditions are stable to the set values or are varying, based on the result of comparison by the monitoring means between the measured value pattern and the set value pattern as time-sequential data. In other words, the instability-causing factor indicating means detects factors of stability and factors of instability, and predicts occurrence of a failure based on the result of detection.

With the foregoing management system for semiconductor fabrication devices in which data are collected at all times, a degree of stability and variability of the fabrication device can be checked based on the data. More specifically, which factor is stable and which factor is unstable can be determined, factors of instability can be limitedly identified, and the device can be modified by process changing. In so doing, stable operations of the fabrication process can be maintained.

Incidentally, in the case of the product quality varies in spite of stability of the control state of the fabrication device, sensors may be added to monitor more items.

The management system for semiconductor fabrication devices in accordance with the present invention may be arranged so as to further include maintenance alarm indicating means for raising an alarm to inform necessity of maintenance of the fabrication device, the alarm being raised by predicting degradation of the fabrication device based on detection of changes with time in the measured value pattern based on a result of the comparison by the monitoring means.

With the foregoing arrangement in which states before the processing, during the processing, and after the processing are monitored by detecting sensor data of the fabrication device and in which the maintenance alarm indicating means is made to predict an optimal timing to carry out maintenance with respect to the fabrication device and the component members thereof, costs for maintenance can be reduced, thereby ensuring the lowering of costs.

More specifically, with the foregoing management system for semiconductor fabrication devices, by efficiently collecting data at all times and by comparing the same, changes in measured values with time regarding the fabrication device are grasped and reported. Besides, by determining trend changes and cyclic changes based on the data about changes with time, degradation of component members of the fabrication device can be discovered, and therefore, component members to be subjected to maintenance and timings of maintenance are determined. Consequently, it is possible to raise an alarm to inform necessity of maintenance in an optimally efficient cycle.

Furthermore, it is also possible to cause the fabrication device to carry out self-inspection and to report the result of the same. In other words, by arranging the fabrication device so as to carry out self-inspection at a predetermined point (during a predetermined period of time, or a predetermined number of times during a predetermined time) and to report the measured data and the data about changes with time, a maintenance timing can be predicted and an alarm to inform the necessity of maintenance can be raised.

The management system for semiconductor fabrication devices in accordance with the present invention may be arranged so as to further include fabrication process line control means for controlling the fabrication process line including the fabrication device based on a result of the comparison by the monitoring means.

According to the foregoing arrangement, the fabrication process line control means manages data obtained from the sensors in the fabrication devices provided in the fabrication process line, monitors the process state of the fabrication process line, and upon occurrence of a failure, stops the fabrication device having the failure and carries out adjustment with the other fabrication devices. Thus, it is possible to control the fabrication process line so as to maintain stable operation of the fabrication process line.

The management system for semiconductor fabrication devices in accordance with the present invention may be arranged so as to further include second instruction generating means for calculating a sequence waiting time since the state becomes stable until a next sequence starts, based on a result of the comparison by the monitoring means, and for instructing adjustment of a sequence of the fabrication device.

According to the foregoing arrangement, the second instruction generating means measures as a redundancy time a period of time since the state monitored by the monitoring means becomes stable until a next sequence starts, and generates an instruction for changing the sequence so that the redundancy time is shortened. This enables to shorten the redundancy time between the sequences. Consequently, in the foregoing management system for semiconductor fabrication devices, it becomes possible to achieve a production sequence with a high efficiency while ensuring the stable operation of the fabrication process line, thereby improving production efficiency.

In this aspect, conventionally, theoretical sequence reduction has been closely examined and improvement of productivity have had to be confirmed based on data of experiments. Conversely, in the foregoing management system for semiconductor fabrication devices provided with the second instruction generating means, data are always collected, and support for the sequence time reduction can be therefore obtained from data in the stable state. As a result, it is possible to immediately take measures for improvement of productivity.

The management system for semiconductor fabrication devices in accordance with the present invention may be further arranged so that the fabrication device is a chemical vapor deposition system in a liquid crystal substrate fabrication process line, and is provided with a radio frequency electric power progressive wave sensor, a gas flow rate sensor, and a film forming chamber pressure sensor as the sensor.

With the foregoing arrangement, in the case where a chemical vapor deposition system in the liquid crystal substrate fabrication process line is monitored by means of electric control waveform signals, only a RF electric power progressive wave sensor, a gas flow rate sensor, and a film forming chamber pressure sensor may be provided as sensors, so as to monitor the waveform data at falls thereof.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A management system for a semiconductor fabrication device, comprising:
    a sensor for always collecting management information from a fabrication device provided in a semiconductor fabrication process line;
    monitoring means for monitoring the management information collected by said sensor as a time-sequential measured value pattern, and for comparing the measured value pattern with a set value pattern registered beforehand in accordance with the management information; and
    first instruction generating means for calculating a sequence waiting time since a state becomes stable until a next sequence starts, based on a result of the comparison by said monitoring means, and for instructing adjustment of a sequence of said fabrication device.

2. The management system for a semiconductor fabrication device as set forth in claim 1, further comprising:
    alarming means for indicating occurrence of a failure in the case where deviation of the measured value pattern from the set value pattern is detected as a result of the comparison by said monitoring means.

3. The management system for a semiconductor fabrication device as set forth in claim 2, further comprising:
    fabrication process line control means for outputting a device stop signal to said fabrication device in response to an output of said alarming means, to stop said fabrication device.

4. The management system for a semiconductor fabrication device as set forth in claim 1, wherein:
    said monitoring means compares the measured value pattern with the set value pattern during a period of time in which a certain steady state of said fabrication device shifts to a next different steady state thereof.

5. The management system for a semiconductor fabrication device as set forth in claim 1, further comprising:
    defective product identifying means for identifying a defective product on said fabrication process line based on a result of the comparison by said monitoring means.

6. The management system for a semiconductor fabrication device as set forth in claim 1, further comprising:
    second instruction generating means for instructing adjustment of a sequence of said fabrication device based on a result of the comparison by said monitoring means, so as to eliminate a deviation of the measured value pattern from the set value pattern.

7. The management system for a semiconductor fabrication device as set forth in claim 1, further comprising:
    instability-causing factor indicating means for detecting instability of the measured value pattern and for indicating presumed factors causing the instability, based on a result of the comparison by said monitoring means.

8. The management system for a semiconductor fabrication device as set forth in claim 1, further comprising:
    maintenance alarm indicating means for raising an alarm to inform necessity of maintenance of said fabrication device, the alarm being raised by predicting degradation of said fabrication device based on detection of changes with time in the measured value pattern based on a result of the comparison by said monitoring means.

9. The management system for a semiconductor fabrication device as set forth in claim 1, further comprising:
    fabrication process line control means for controlling said fabrication process line including said fabrication device based on a result of the comparison by said monitoring means.

10. The management system for a semiconductor fabrication device as set forth in claim 1, wherein:
    said monitoring means presumes causes of changes of characteristics of said fabrication device, based on sudden changes in data of the management information.

11. The management system for a semiconductor fabrication device as set forth in claim 1, wherein:
said monitoring means presumes causes of changes of characteristics of said fabrication device, based on changes with time in data of the management information.

12. The management system for a semiconductor fabrication device as set forth in claim 1, wherein:
in the case where a failure occurs to said fabrication device, presumed causes of the failure are shown in a descending order of probability of occurrence.

13. The management system for a semiconductor fabrication device as set forth in claim 1, wherein:
in the case where a failure occurs to said fabrication device, a method for inspecting causes of the failure and a method for determining the causes of the failure are shown.

14. The management system for a semiconductor fabrication device as set forth in claim 1, wherein:
in the case where a failure occurs to said fabrication device, self-inspection to determine causes of the failure is carried out with respect to presumed causes of the failure in a descending order of probability of occurrence.

15. The management system for a semiconductor fabrication device as set forth in claim 1, wherein:
intermediates of semiconductors are individually and separately managed in said fabrication process line.

16. A management system for a semiconductor fabrication device, comprising:
a sensor for always collecting management information from a fabrication device provided in a semiconductor fabrication process line; and
monitoring means for monitoring the management information collected by said sensor as a time-sequential measured value pattern, and for comparing the measured value pattern with a set value pattern registered beforehand in accordance with the management information, wherein
said fabrication device is a chemical vapor deposition system in a liquid crystal substrate fabrication process line, and is provided with a radio frequency electric power progressive wave sensor, a gas flow rate sensor, and a film forming chamber pressure sensor as said sensor.

17. A management system for a semiconductor fabrication device, comprising:
a sensor for always collecting management information from a fabrication device provided in a semiconductor fabrication process line; and
monitoring means for monitoring the management information collected by said sensor as a time-sequential measured value pattern, and for comparing the measured value pattern with a set value pattern registered beforehand in accordance with the management information, wherein
said monitoring means presumes causes of changes of characteristics of said fabrication device, based on a time-base order of changes in data of the management information.

18. A semiconductor fabrication device management method, comprising the steps of:
monitoring management information collected by a sensor as a time-sequential measured value pattern, the sensor always collecting management information from a fabrication device provided in a semiconductor fabrication process line;
comparing the measured value pattern with a set value pattern registered beforehand in accordance with the management information; and
calculating a sequence waiting time since a state becomes stable until a next sequence based on a result of the comparison between the measured value pattern and the set value pattern, and for instructing adjustment of a sequence of the fabrication device.

19. The semiconductor fabrication device management method as set forth in claim 18, further comprising the step of:
indicating occurrence of a failure in the case where deviation of the measured value pattern from the set value pattern is detected as a result of comparison between the measured value pattern and the set value pattern.

20. The semiconductor fabrication device management method as set forth in claim 19, further comprising the step of:
outputting a device stop signal to the fabrication device based on the indication of occurrence of a failure, to stop the fabrication device.

21. The semiconductor fabrication device management method as set forth in claim 18, wherein:
the comparison between the measured value pattern and the set value pattern is carried out during a period of time in which a certain steady state of the fabrication device shifts to a next different steady state.

22. The semiconductor fabrication device management method as set forth in claim 18, further comprising the step of:
identifying a defective product on the fabrication process line based on a result of the comparison between the measured value pattern and the set value pattern.

23. The semiconductor fabrication device management method as set forth in claim 18, further comprising the step of:
instructing adjustment of a sequence of the fabrication device based on a result of the comparison between the measured value pattern and the set value pattern, so as to eliminate a deviation of the measured value pattern from the set value pattern.

24. The semiconductor fabrication device management method as set forth in claim 18, further comprising the step of:
detecting instability of the measured value pattern and indicating presumed factors causing the instability, based on a result of the comparison between the measured value pattern and the set value pattern.

25. The semiconductor fabrication device management method as set forth in claim 18, further comprising the step of:
detecting changes with time of the measured value pattern based on a result of the comparison between the measured value pattern and the set value pattern, predicting degradation of the fabrication device, and raising an alarm to inform necessity of maintenance of the fabrication device.

26. The semiconductor fabrication device management method as set forth in claim 18, further comprising the step of:
controlling the fabrication process line including the fabrication device based on a result of the comparison between the measured value pattern and the set value pattern.

27. A semiconductor fabrication device management method, comprising:

monitoring management information collected by a sensor as a time-sequential measured value pattern, the sensor always collecting management information from a fabrication device provided in a semiconductor fabrication process line; and comparing the measured value pattern with a set value pattern registered beforehand in accordance with the management information, wherein the fabrication device is a chemical vapor deposition system in a liquid crystal substrate fabrication process line; and wherein the management information is collected by means of a radio frequency electric power progressive wave sensor, a gas flow rate sensor, and a film forming chamber pressure sensor, each of which functions as said sensor.

* * * * *